(12) United States Patent
Lin et al.

(10) Patent No.: US 12,727,222 B2
(45) Date of Patent: Sep. 1, 2026

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Tsung-Da Lin, Pingtung County (TW); Chia-Wei Hsu, New Taipei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 933 days.

(21) Appl. No.: 17/735,526

(22) Filed: May 3, 2022

(65) Prior Publication Data

US 2023/0115634 A1 Apr. 13, 2023

Related U.S. Application Data

(60) Provisional application No. 63/254,790, filed on Oct. 12, 2021.

(51) Int. Cl.

| | |
|---|---|
| ***H10D 64/01*** | (2025.01) |
| ***H10D 30/67*** | (2025.01) |
| ***H10D 62/10*** | (2025.01) |
| ***H10P 95/00*** | (2026.01) |

(52) U.S. Cl.

CPC ......... *H10D 64/01* (2025.01); *H10D 30/6735* (2025.01); *H10D 62/119* (2025.01); *H10D 64/01316* (2026.01); *H10P 95/00* (2026.01)

(58) Field of Classification Search

CPC ........... H01L 29/42392; H01L 29/0669; H01L 21/321; H01L 29/401

See application file for complete search history.

(56) References Cited

U.S. PATENT DOCUMENTS

| | | | | |
|---|---|---|---|---|
| 6,586,328 | B1 * | 7/2003 | Adesida | H01L 21/28575 438/513 |
| 9,985,023 | B1 * | 5/2018 | Liu | H01L 21/76897 |
| 10,522,358 | B2 | 12/2019 | Wang et al. | |
| 11,264,477 | B2 | 3/2022 | He et al. | |

(Continued)

FOREIGN PATENT DOCUMENTS

| | | |
|---|---|---|
| CN | 109427590 A | 3/2019 |
| CN | 112542456 A | 3/2021 |

(Continued)

*Primary Examiner* — Dale E Page

(74) *Attorney, Agent, or Firm* — Slater Matsil, LLP

(57) ABSTRACT

In an embodiment, a method includes: forming a gate dielectric layer on a channel region of a semiconductor feature; depositing a work function tuning layer on the gate dielectric layer, the work function tuning layer including a first work function tuning element; depositing a capping layer on the work function tuning layer with atomic layer deposition, the capping layer formed of an oxide or a nitride; performing an anneal process while the capping layer covers the work function tuning layer, the anneal process driving the first work function tuning element from the work function tuning layer into the gate dielectric layer; removing the capping layer to expose the work function tuning layer; and depositing a fill layer on the work function tuning layer.

20 Claims, 31 Drawing Sheets

(56) References Cited

U.S. PATENT DOCUMENTS

2010/0148280 A1 6/2010 Mitsuhashi
2010/0197128 A1 8/2010 Schaeffer et al.
2011/0117698 A1 5/2011 Suzawa et al.
2015/0214112 A1 7/2015 Zhao
2017/0133278 A1 5/2017 Bao et al.
2017/0178973 A1 6/2017 Lee et al.
2017/0323949 A1 11/2017 Loubet et al.
2018/0145149 A1 5/2018 Chiang et al.
2019/0096680 A1 3/2019 Wei et al.
2019/0318967 A1 10/2019 Chen et al.
2020/0105533 A1* 4/2020 Chen ................. H01L 21/28185
2020/0243522 A1 7/2020 Cheng et al.
2021/0057282 A1* 2/2021 Chen ................. H01L 21/31144
2021/0098457 A1* 4/2021 Cheng ............. H01L 21/823821
2021/0193454 A1 6/2021 Ko et al.
2021/0249517 A1 8/2021 Cheng et al.
2021/0313219 A1* 10/2021 Lee ................... H01L 29/42376
2021/0366783 A1 11/2021 Chu et al.

FOREIGN PATENT DOCUMENTS

CN 113421854 A 9/2021
EP 2717308 A1 4/2014

* cited by examiner

50N/50P
122
68
68
68
96
124
90
104
102
98
66
62
50

50N/50P
124
68
122
70
62
50

50N/50P
90
102
90
90
102
90
104
104
98
98
68
68
68
50B
114
112
62
50

50N/50P
114
50A
68
68
62
62
70
70
70
112
50

TRANSISTOR GATE STRUCTURES AND METHODS OF FORMING THE SAME

PRIORITY CLAIM AND CROSS-REFERENCE

This application claims the benefit of U.S. Provisional Application No. 63/254,790, filed on Oct. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 23A-30B are views of intermediate stages in the manufacturing of fin field-effect transistors (FinFETs), in accordance with some embodiments.

DETAILED DESCRIPTION

Figure 1:
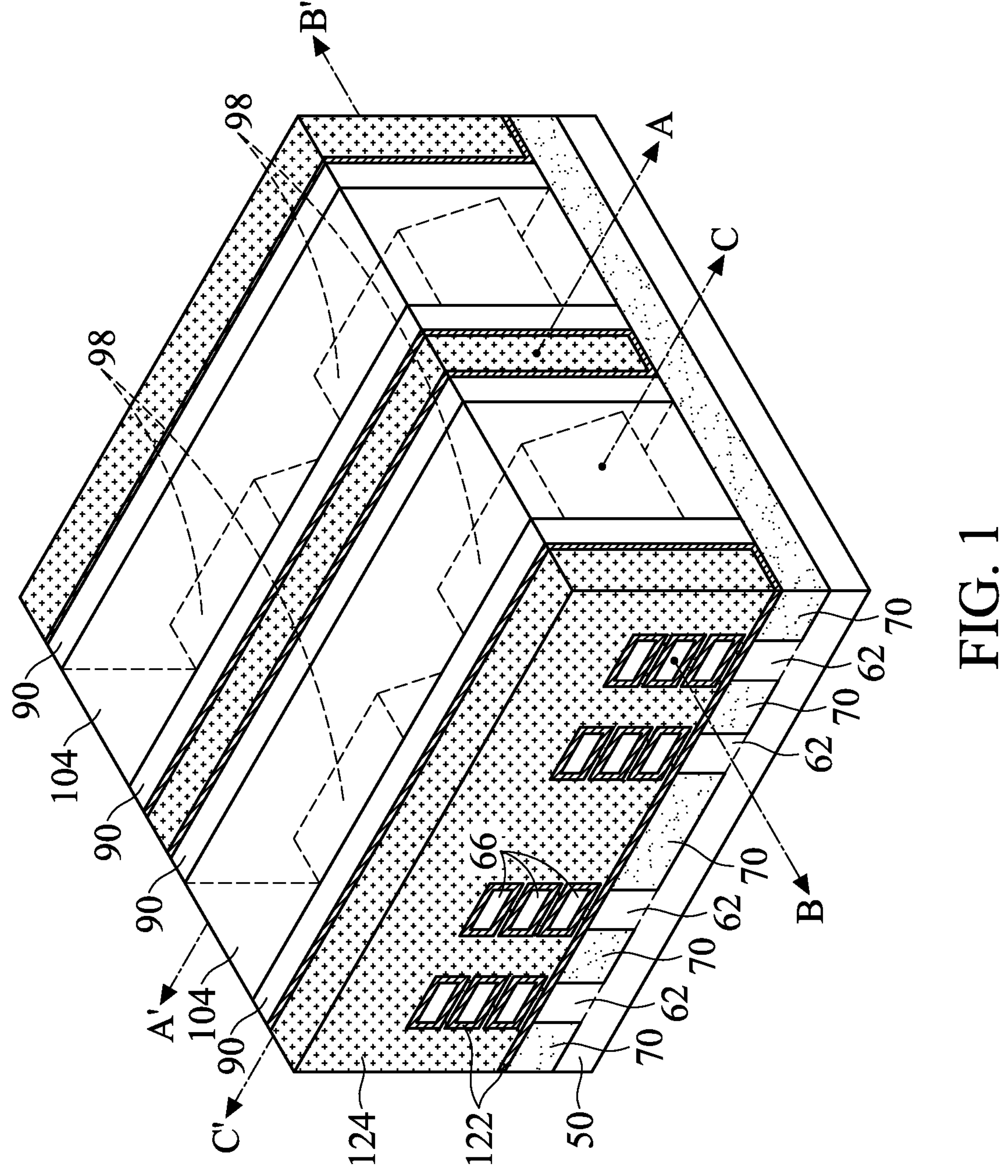
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a gate electrode layer is formed by forming a capping layer on a work function tuning layer. An anneal process is subsequently performed. The capping layer protects the underlying work function tuning layer during the anneal process. The capping layer is formed to a small thickness, which can help avoid merging or seaming of the capping layer, and is formed of a sacrificial material which has good oxidation resistance and acts as a good moisture barrier at small thicknesses. Further, the sacrificial material is capable of being formed by a deposition process with a high degree of conformality, such as atomic layer deposition (ALD). Depositing the sacrificial material with a high degree of conformality can also help avoid merging or seaming of the capping layer. Avoiding merging or seaming of the capping layer advantageously allows the capping layer to be more easily removed with an etch process, decreasing the risk of damage to underlying features. Avoiding damage to those features may increase manufacturing yield of the resulting nano-FETs.

Embodiments are described in a particular context, a die including nano-FETs. Various embodiments may be applied, however, to dies including other types of transistors (e.g., fin field-effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 being semiconductor features which act as channel regions for the nano-FETs. Isolation regions 70, such as shallow trench isolation (STI) regions, are disposed between adjacent fins 62, and the nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are wrapped around the top surfaces, sidewalls, and bottom surfaces of the nanostructures 66. Gate electrodes 124 are over and wrapped around the gate dielectrics 122. Epitaxial source/drain regions 98 are disposed at opposing sides of the gate dielectrics 122 and the gate electrodes 124. An inter-layer dielectric (ILD) 104 is formed over the epitaxial source/drain regions 98. Contacts (subsequently described) to the epitaxial source/drain regions 98 will be formed through the ILD 104. The epitaxial source/drain regions 98 may be shared between various nanostructures 66. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a nanostructure 66 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-22B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 15A, 16A, 17A, 18A, 19A, 20A, 21A, and 22A are cross-sectional views illustrated along a similar cross-section as reference cross-section A-A' in FIG. 1, except two fins are shown. FIGS. 7B, 8B, 9B, 10B, 11B, 12B, 13B, 14B, 15B, 16B, 17B, 18B, 19B, 20B, 21B, and 22B are cross-sectional views illustrated along a similar cross-section as reference cross-section B-B' in FIG. 1. FIGS. 9C and 9D are cross-sectional views illustrated along a similar cross-section as reference cross-section C-C' in FIG. 1, except two fins are shown.

Figure 2:
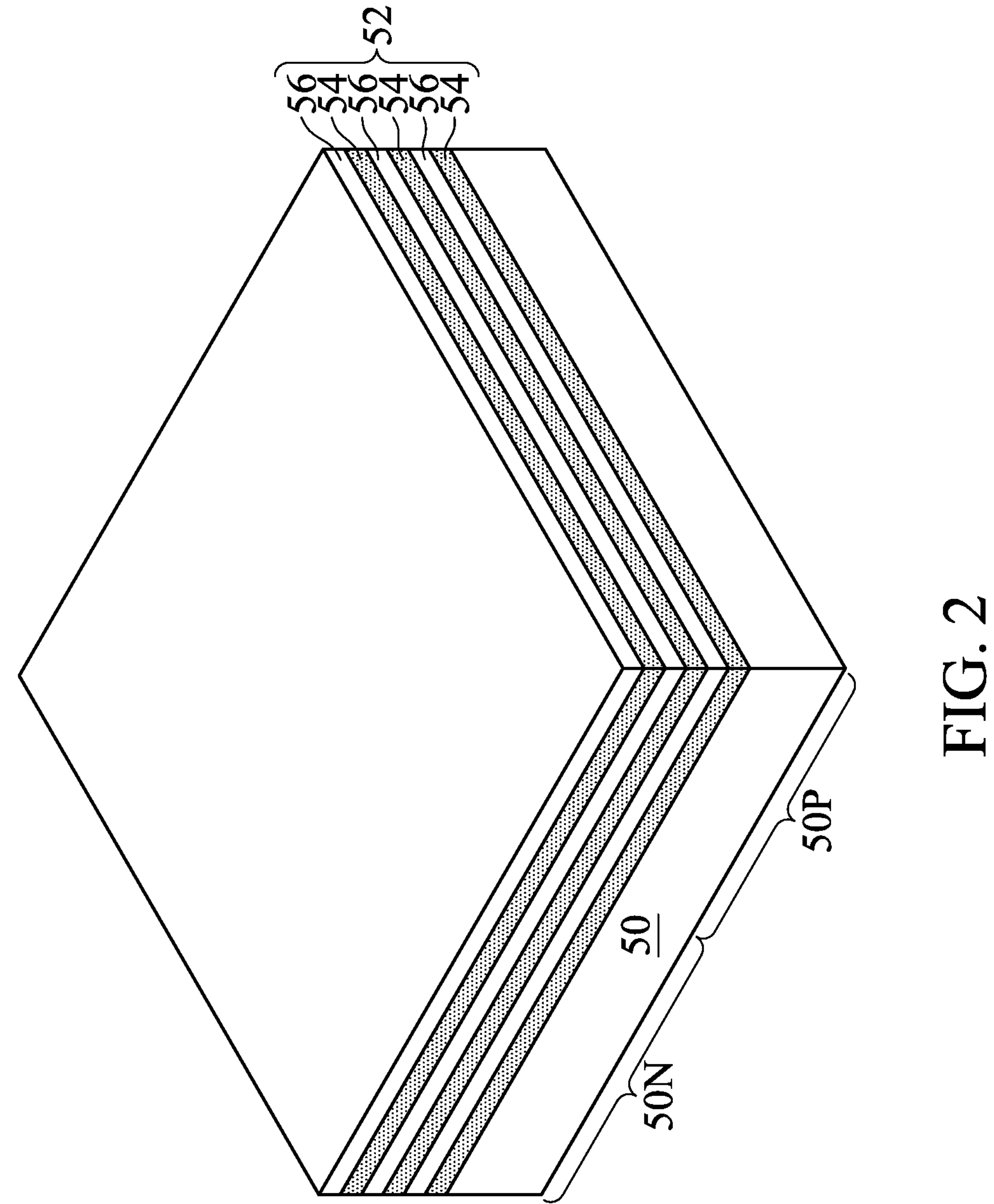
FIGS. 2-22B are views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in the n-type region 50N and the p-type region 50P. The APT region may extend under the source/drain regions in the nano-FETs. The APT region may be used to reduce the leakage from the source/drain regions to the substrate 50. In some embodiments, the impurity concentration in the APT region may be in the range of $10^{18}$ $cm^{-3}$ to $10^{19}$ $cm^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will be patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in the range of 5 nm to 30 nm. In some embodiments, some layers of the multi-layer stack 52 (e.g., the second semiconductor layers 56) are formed to be thinner than other layers of the multi-layer stack 52 (e.g., the first semiconductor layers 54).

Figure 3:
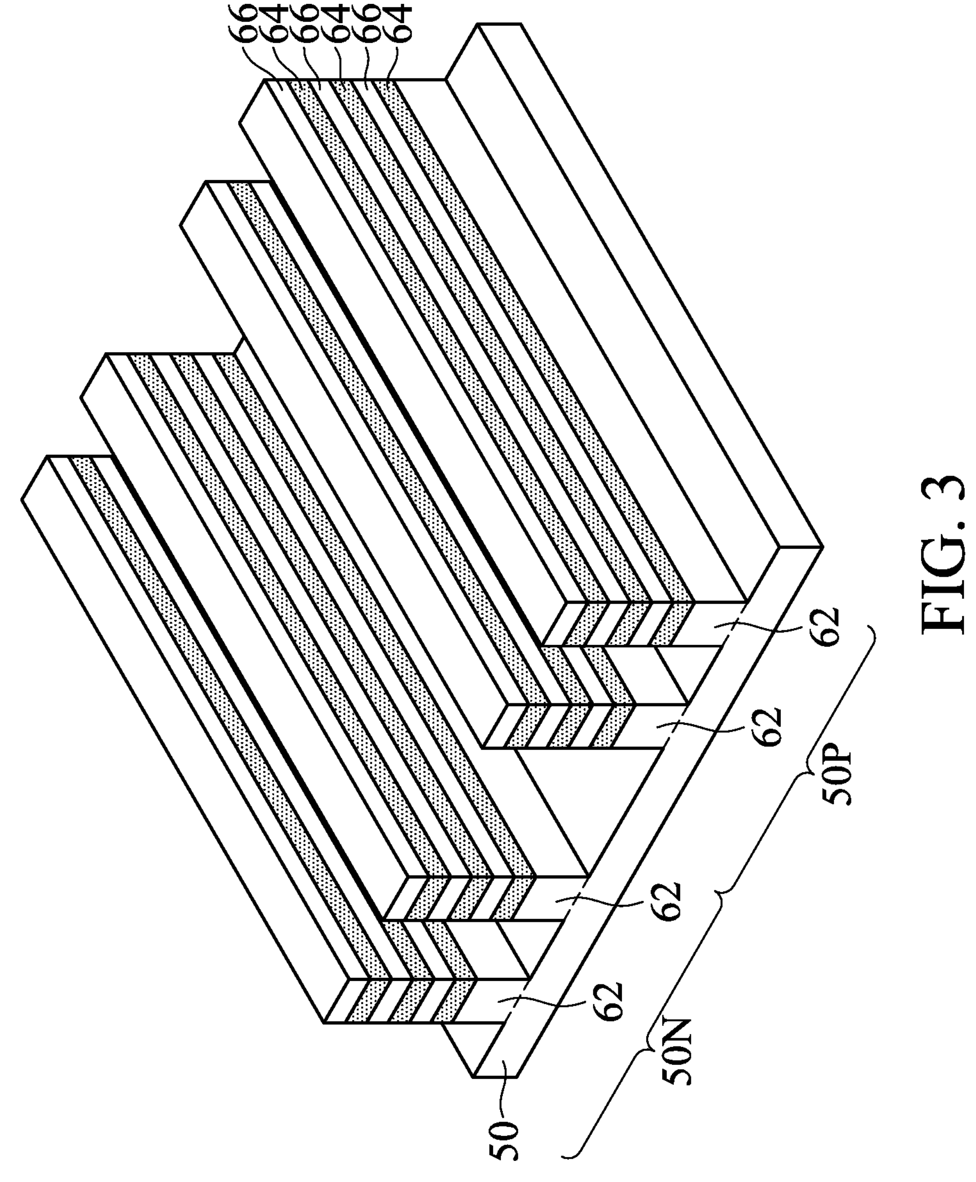

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in the range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
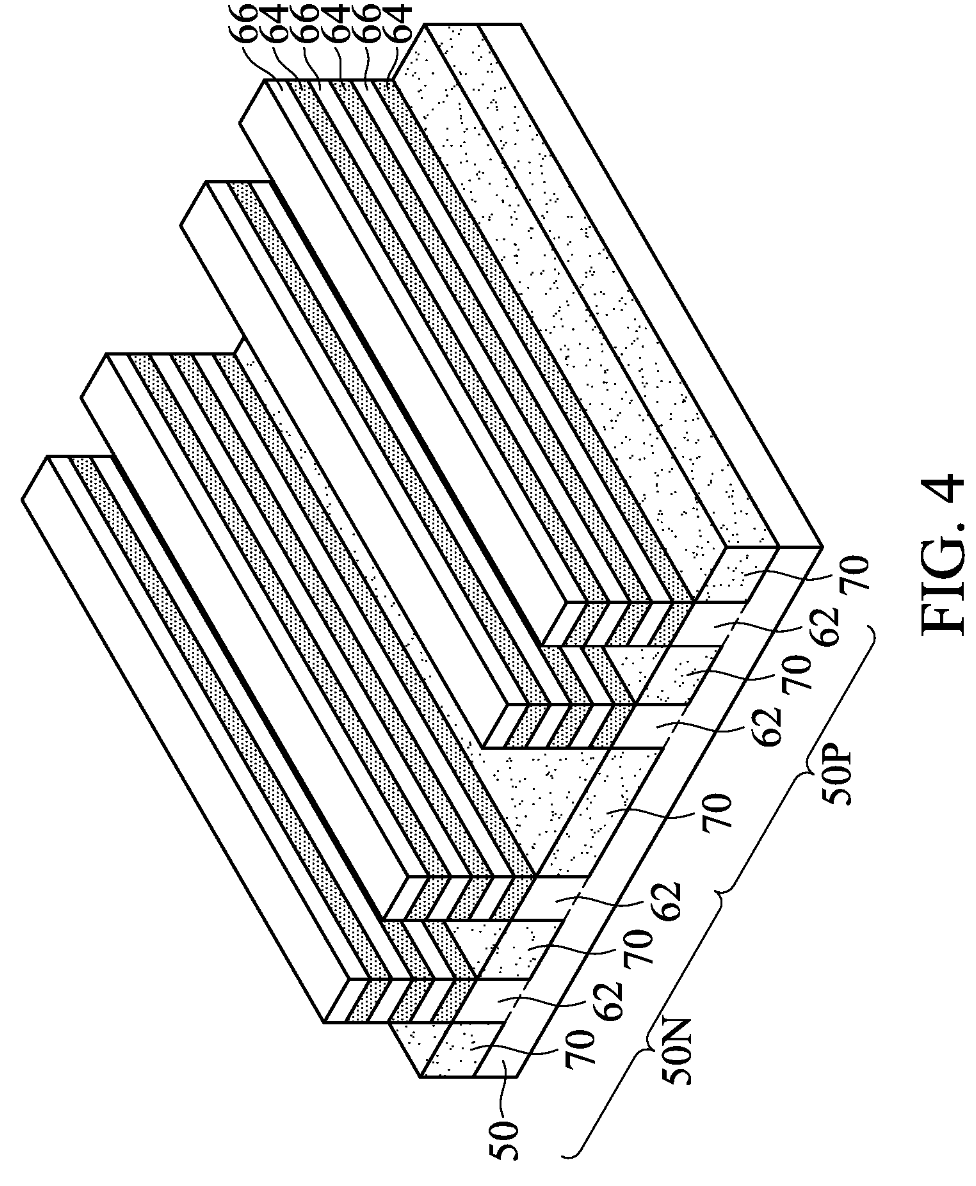

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent nano-FETs.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etch process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50 by doping (e.g., with a p-type or an n-type impurity). The wells may have a conductivity type opposite from a conductivity type of source/drain regions that will be subsequently formed in the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ $cm^{-3}$ to $10^{14}$ $cm^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ $cm^{-3}$ to $10^{14}$ $cm^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
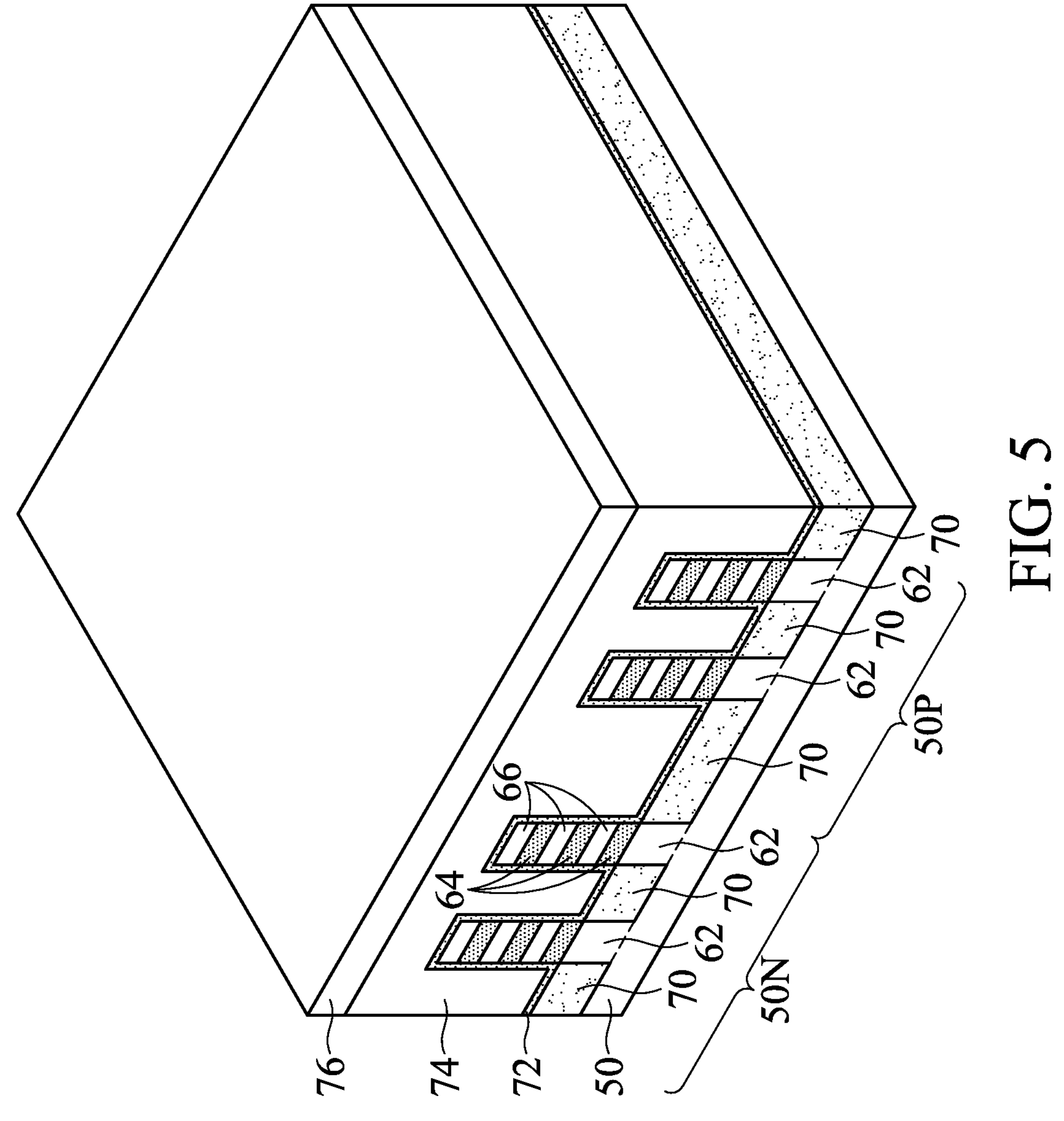

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline silicon (polysilicon), polycrystalline silicon germanium (poly-SiGe), a metal, a metallic nitride, a metallic silicide, a metallic oxide, or the like, which may be formed by a deposition process such as physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
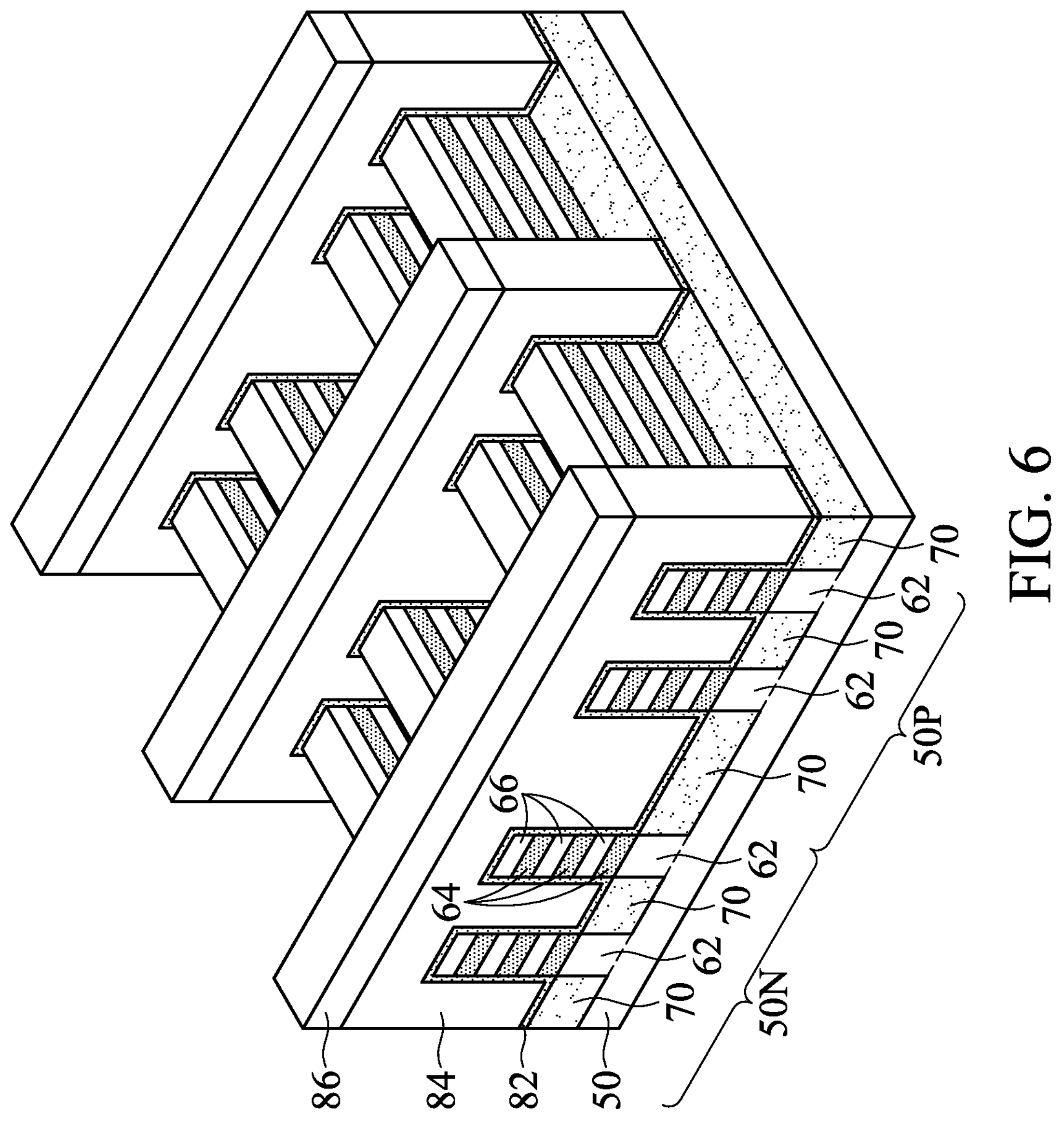

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the second nanostructures 66 that will be patterned to form channel regions 68 (see FIGS. 7A-7B). The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-22B illustrate various additional steps in the manufacturing of embodiment devices. FIGS. 7A-22B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 7B:
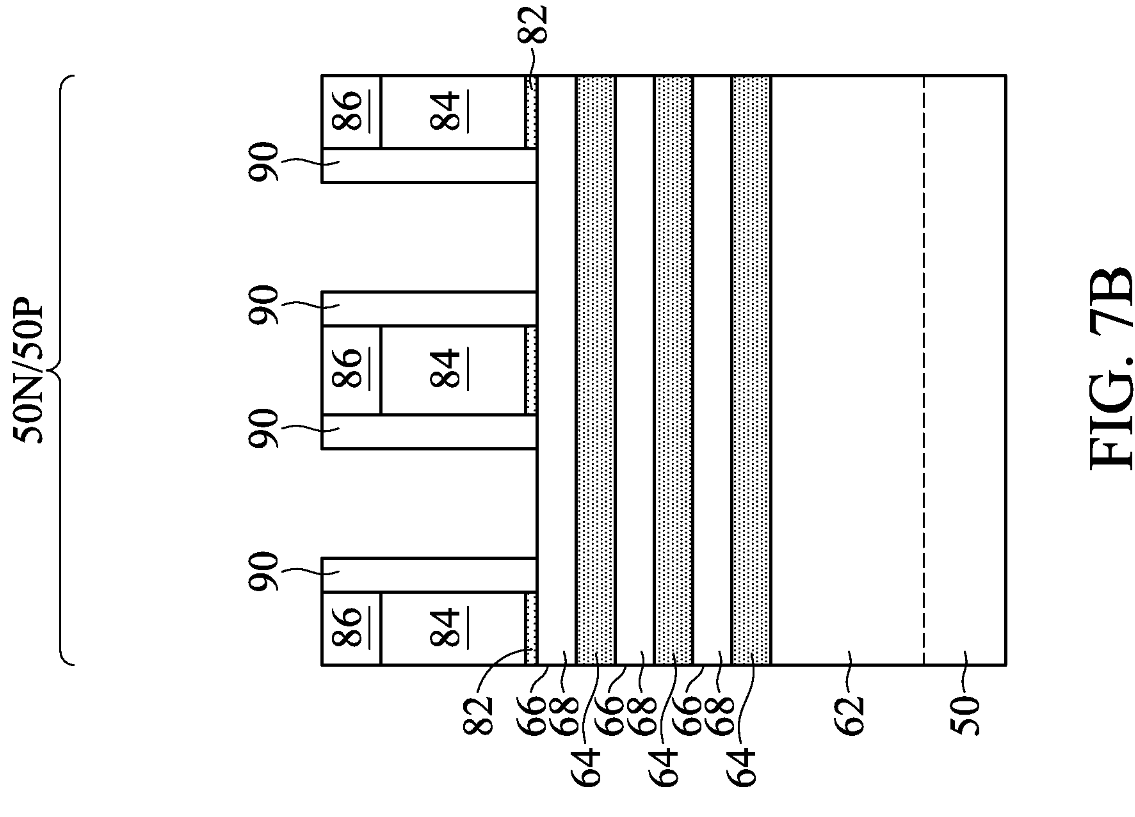
Figure 7A:
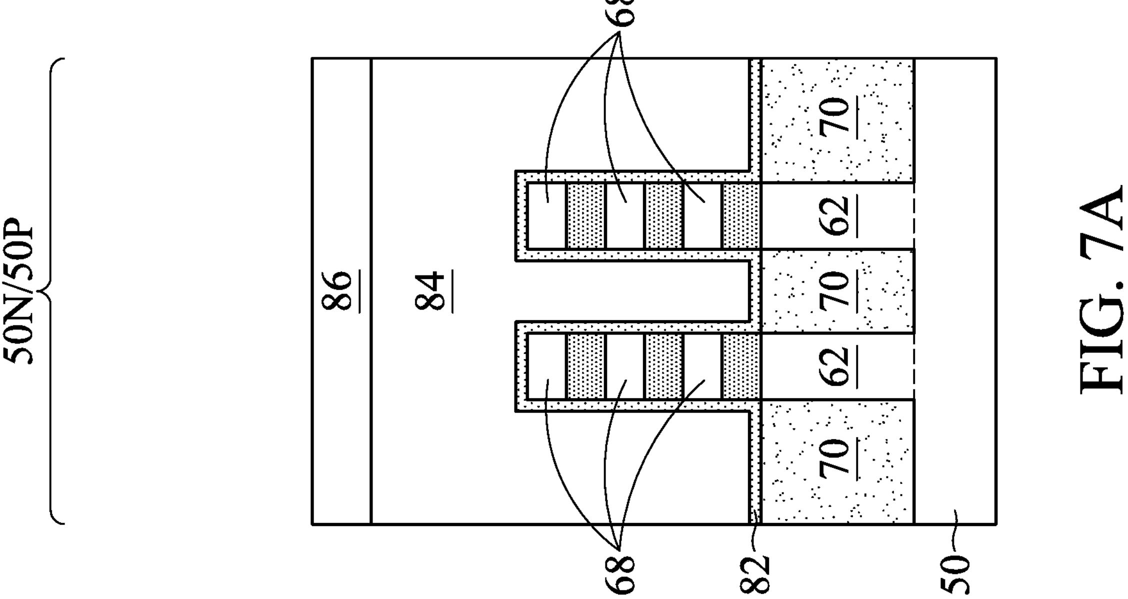

In FIGS. 7A-7B, gate spacers 90 are formed over the nanostructures 64, 66, on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 9C-9D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type (e.g., n-type) impurities may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ $cm^{-3}$ to $10^{19}$ $cm^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
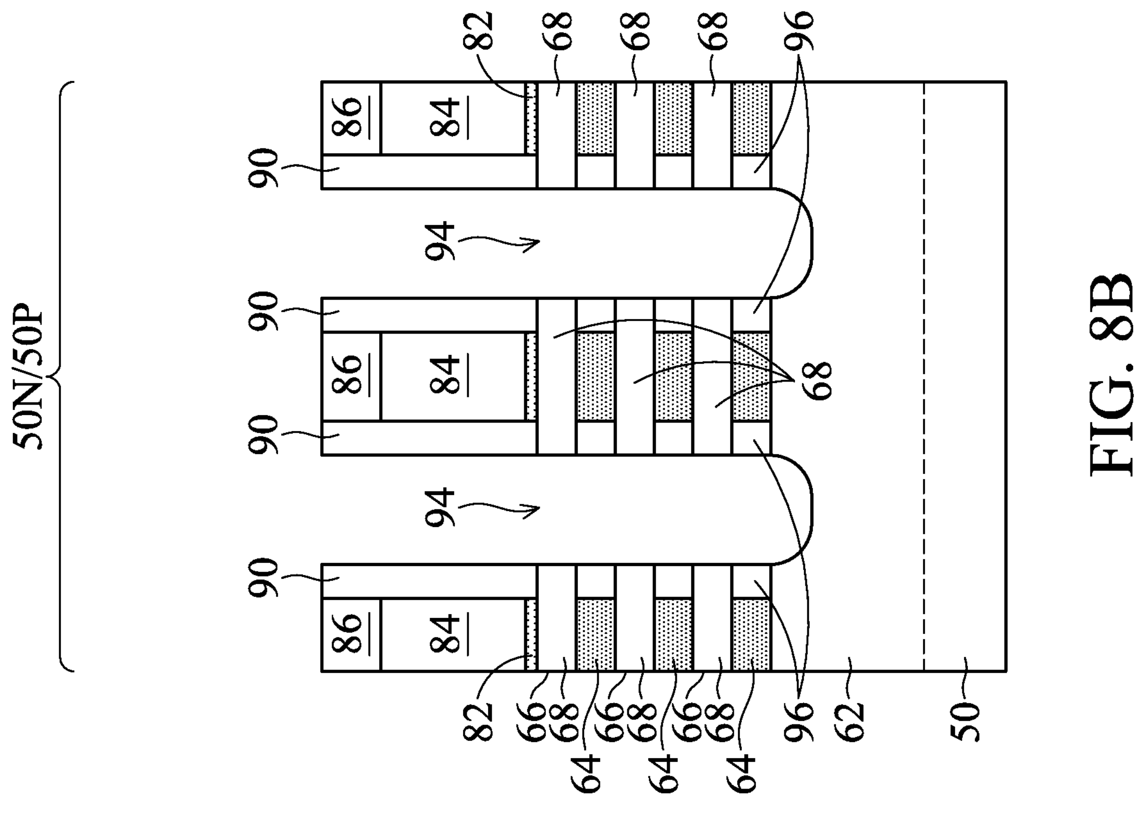
Figure 8A:
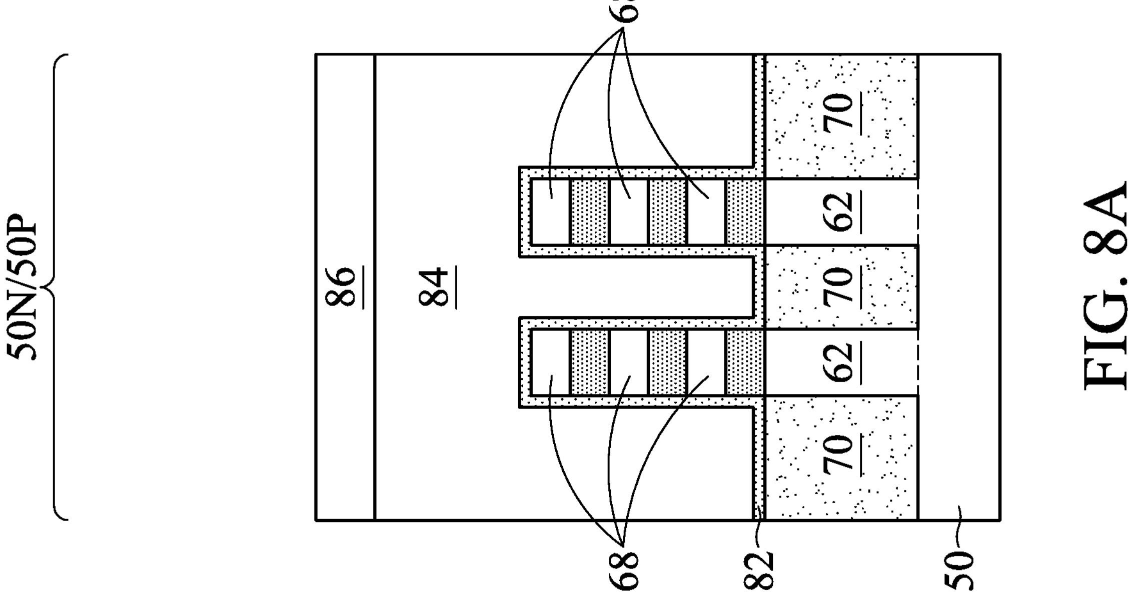

In FIGS. 8A-8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etch process, such as a RIE, a NBE, or the like. The gate spacers 90 and the dummy gates 84 collectively mask portions of the fins 62 and/or the nanostructures 64, 66 during the etch processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etch processes, such as etch processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide ($NH_4OH$), or the like. In another embodiment, the etch process may be a dry etch using a fluorine-based gas such as hydrogen fluoride (HF) gas. In some embodiments, the same etch process may be continually performed to both form the source/drain recesses 94 and recess the sidewalls of the first nanostructures 64. The inner spacers 96 can then be formed by conformally forming an insulating material in the source/drain recesses 94, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 9B:
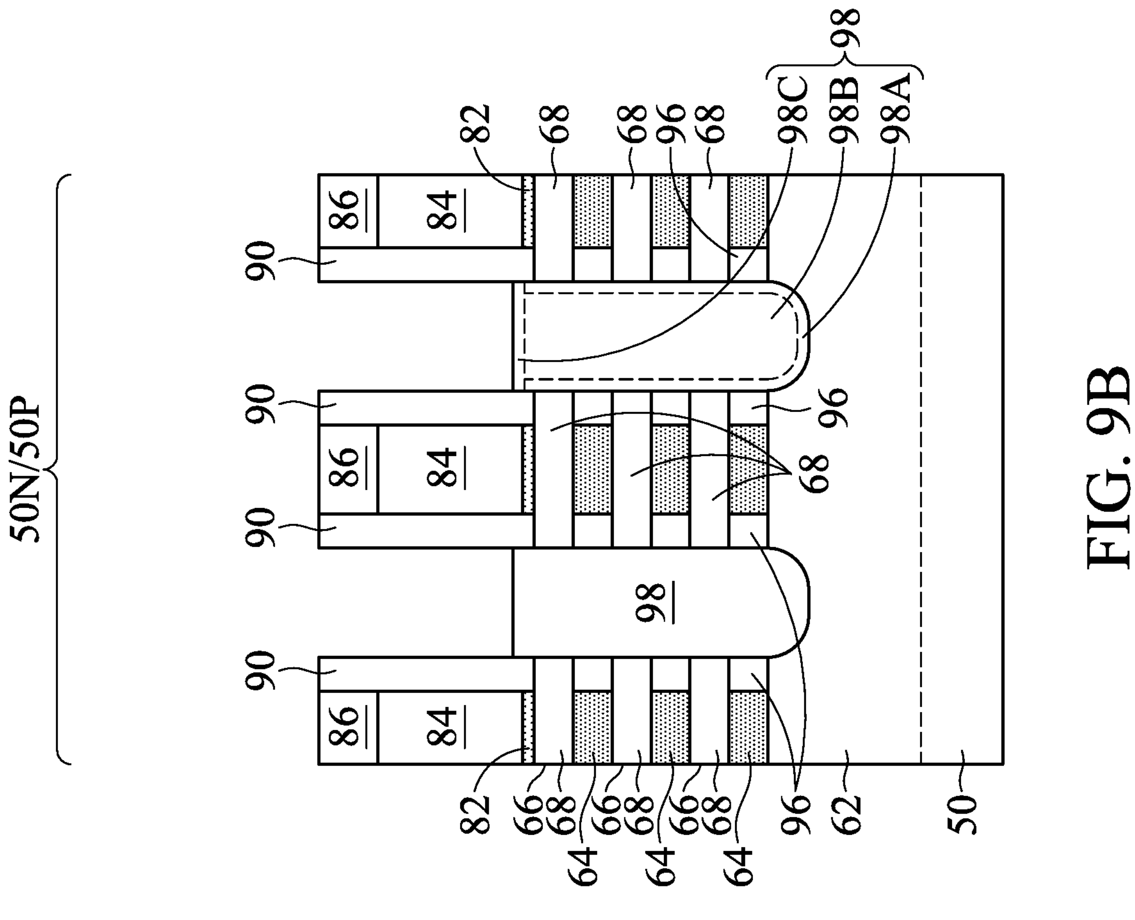
Figure 9A:
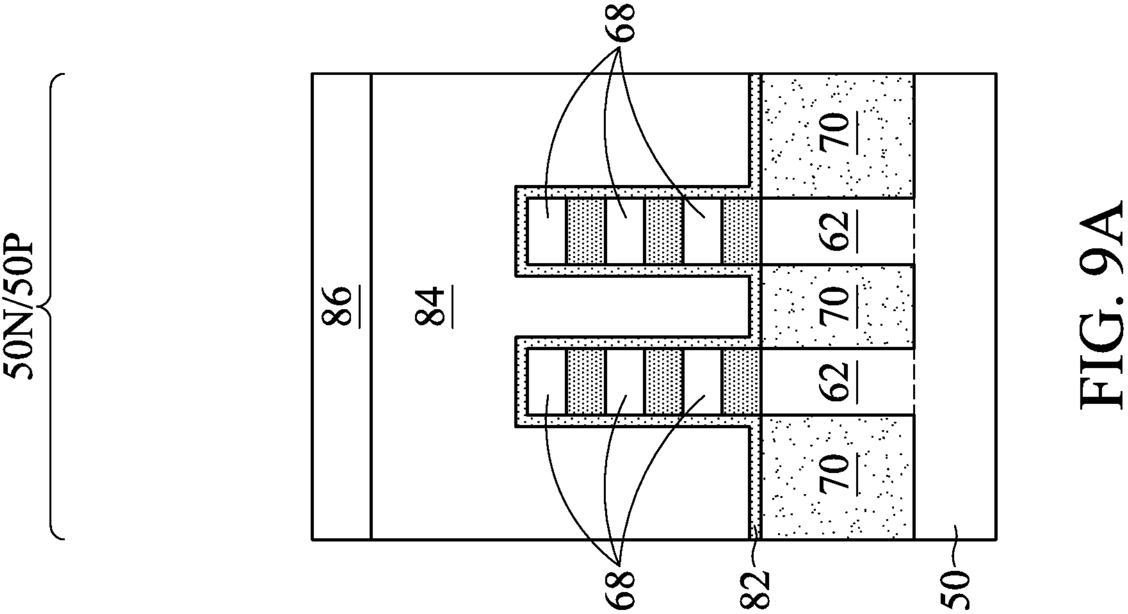
Figure 9D:
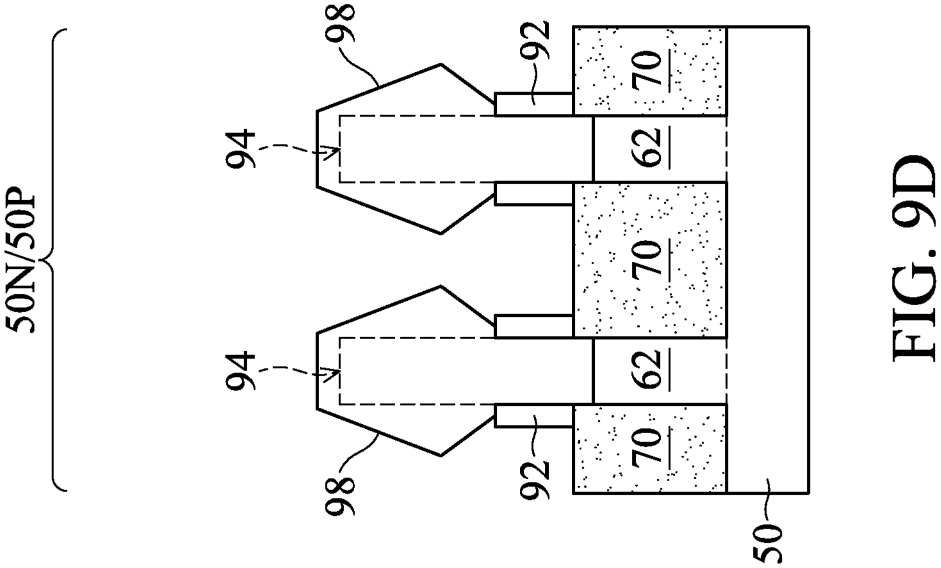
Figure 9C:
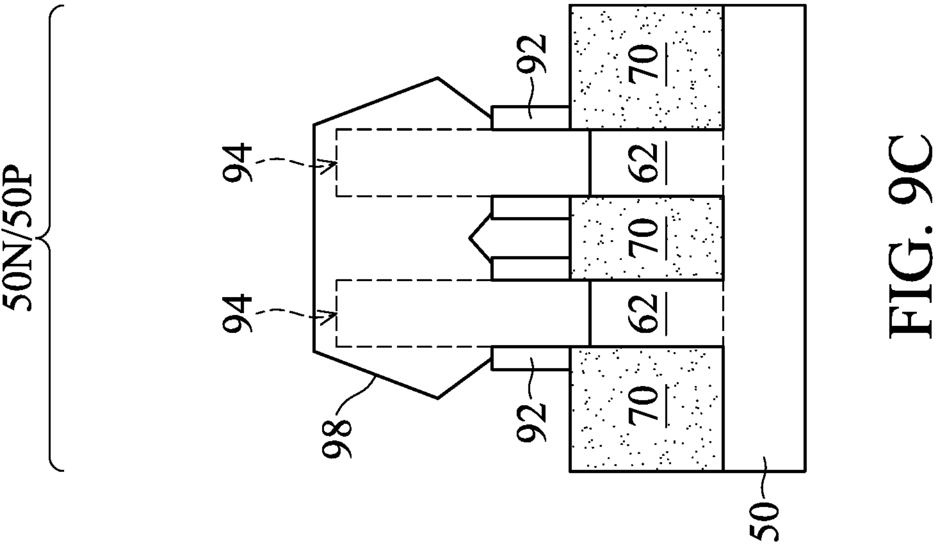

In FIGS. 9A-9B, epitaxial source/drain regions 98 are formed in the source/drain recesses 94. The epitaxial source/drain regions 98 are formed such that each dummy gate 84 (and corresponding channel region 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, if the second nanostructures 66 are silicon, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, if the second nanostructures 66 are silicon, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
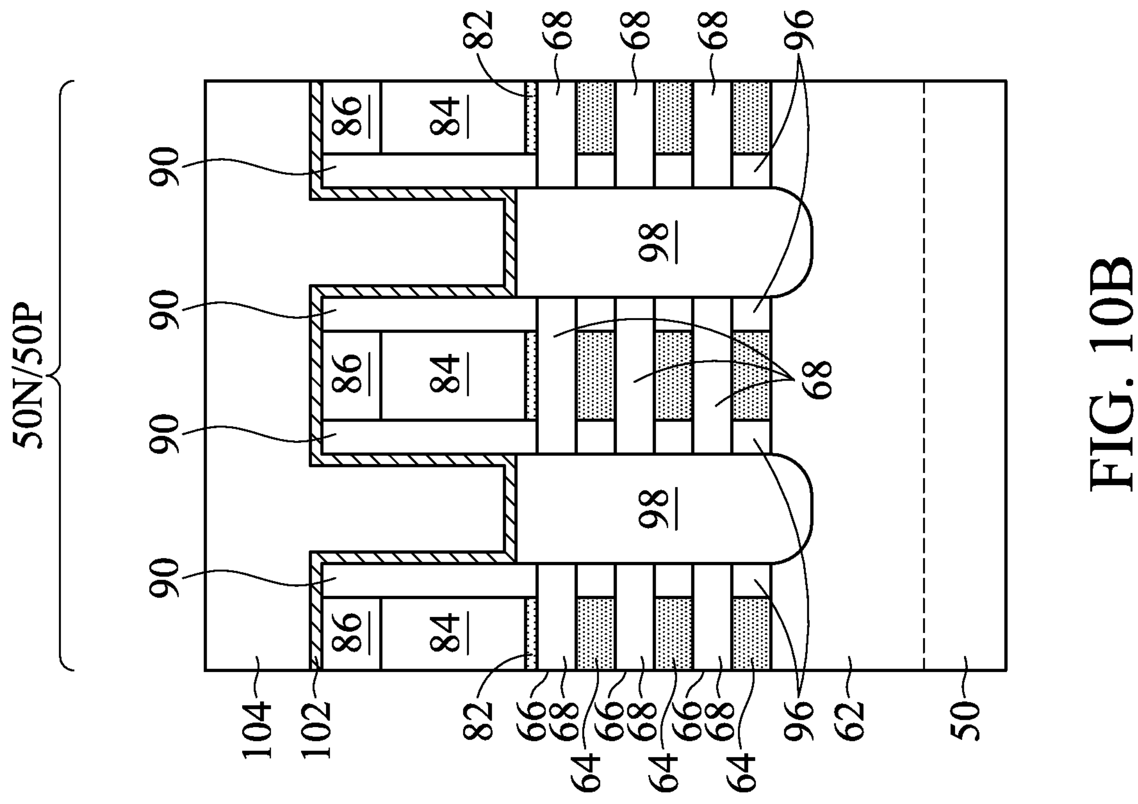
Figure 10A:
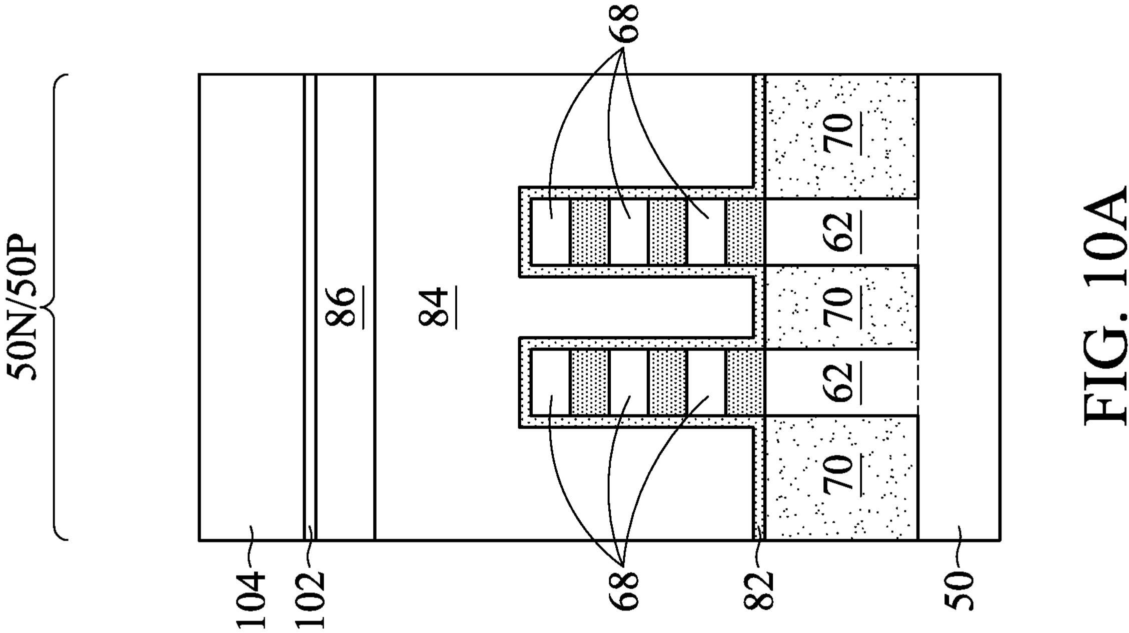

In FIGS. 10A-10B, a first ILD 104 is deposited over the epitaxial source/drain regions 98, the gate spacers 90, and the masks 86 (if present) or the dummy gates 84. The first ILD 104 may be formed of a dielectric material, which may be formed by any suitable deposition process, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material having a high etching selectivity from the etching of the first ILD 104, such as silicon nitride, silicon oxide, silicon oxynitride, or the like, which may be formed by any suitable deposition process, such as CVD, ALD, or the like.

Figure 11B:
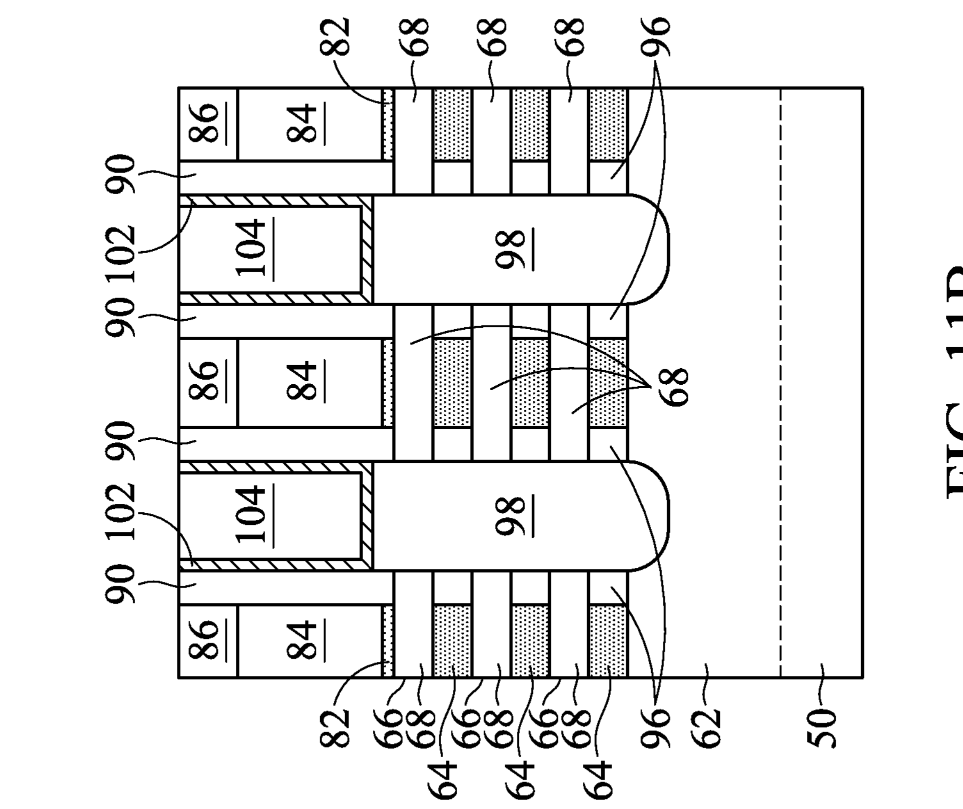
Figure 11A:
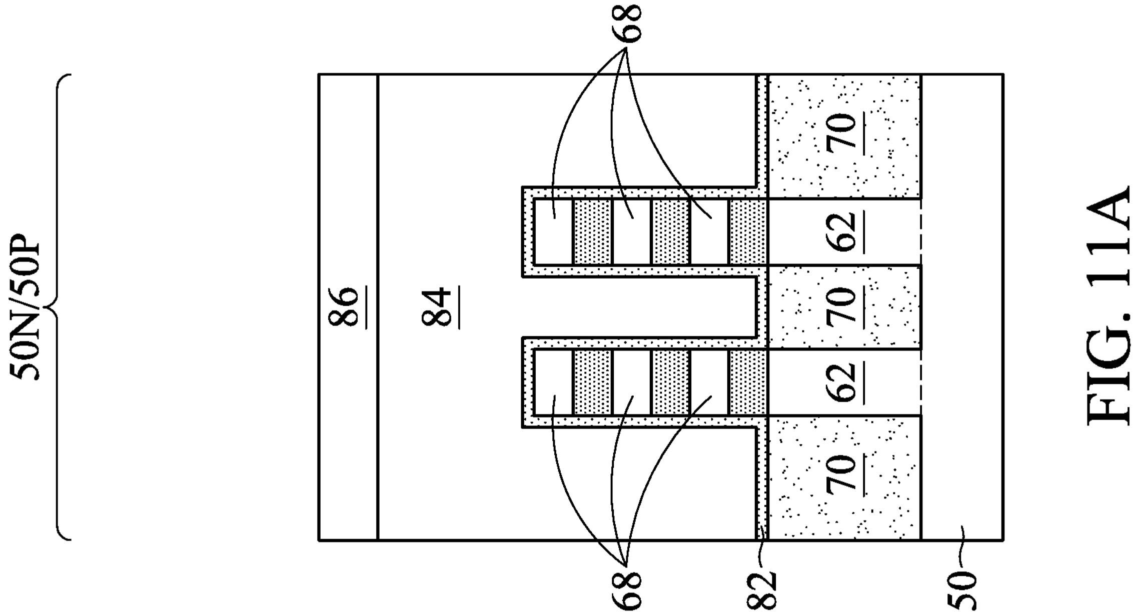

In FIGS. 11A-11B, a removal process is performed to level the top surfaces of the first ILD 104 with the top surfaces of the gate spacers 90 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
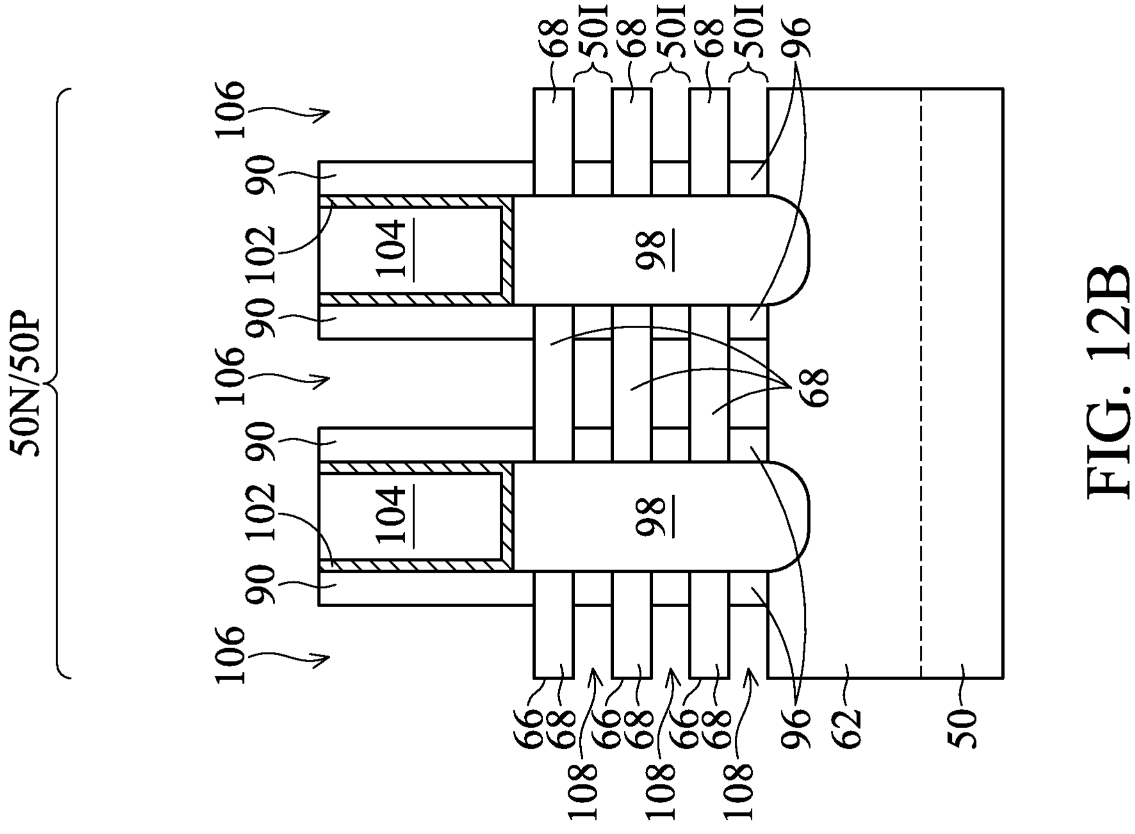
Figure 12A:
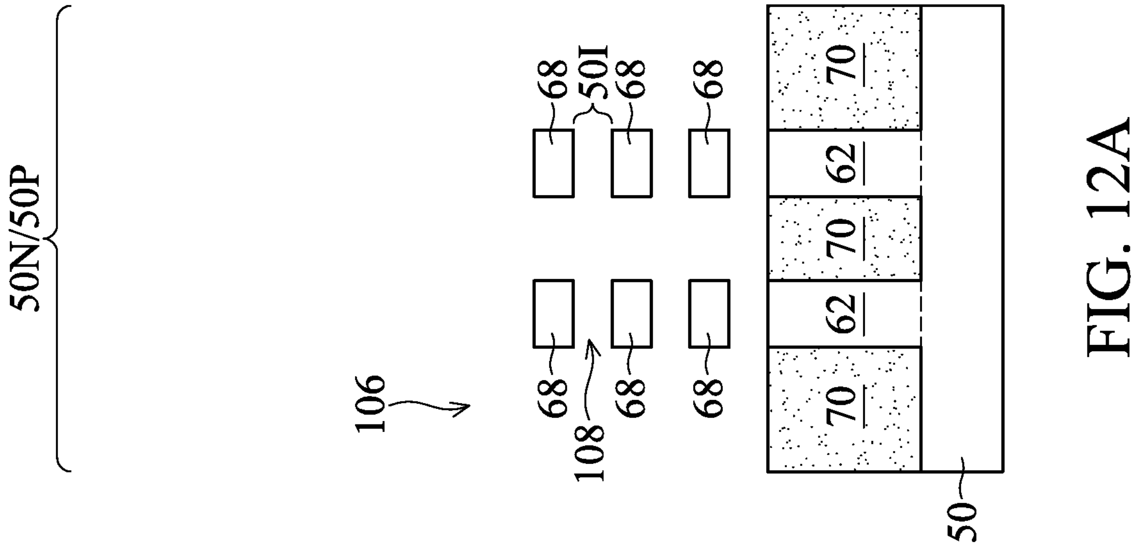

In FIGS. 12A-12B, the masks 86 (if present) and the dummy gates 84 are removed in an etch process, so that recesses 106 are formed. Portions of the dummy dielectrics 82 in the recesses 106 are also removed. In some embodiments, the dummy gates 84 are removed by an anisotropic dry etch. For example, the etch process may include a dry etch using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between and adjoin adjacent pairs of the epitaxial source/drain regions 98.

The remaining portions of the first nanostructures 64 are then removed to expand the recesses 106, such that openings 108 are formed in regions 501 between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66 and expand the openings 108. The openings 108 are small, particularly when the nano-FETs formed at a small technology node. For example, when the nano-FETs are formed at a 3 nm technology node, a width of the openings 108 can be in the range of 50 Å to 350 Å and a height of the openings 108 can be in the range of 50 Å to 350 Å.

Figure 13B:
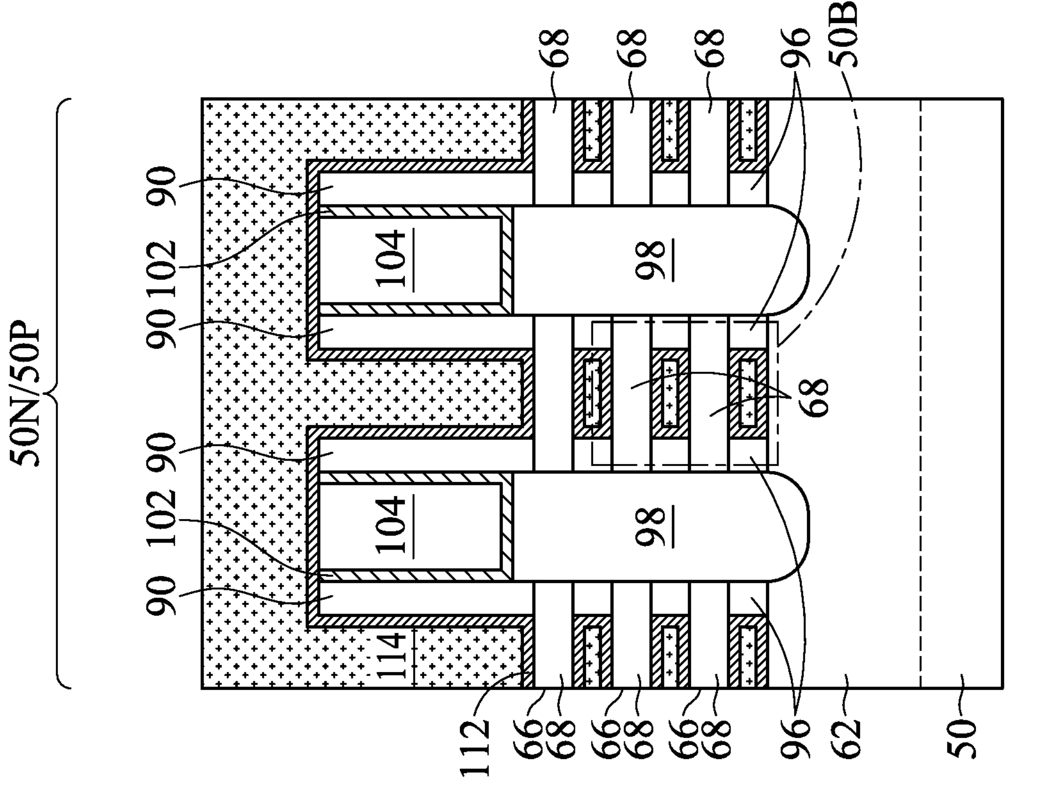
Figure 13A:
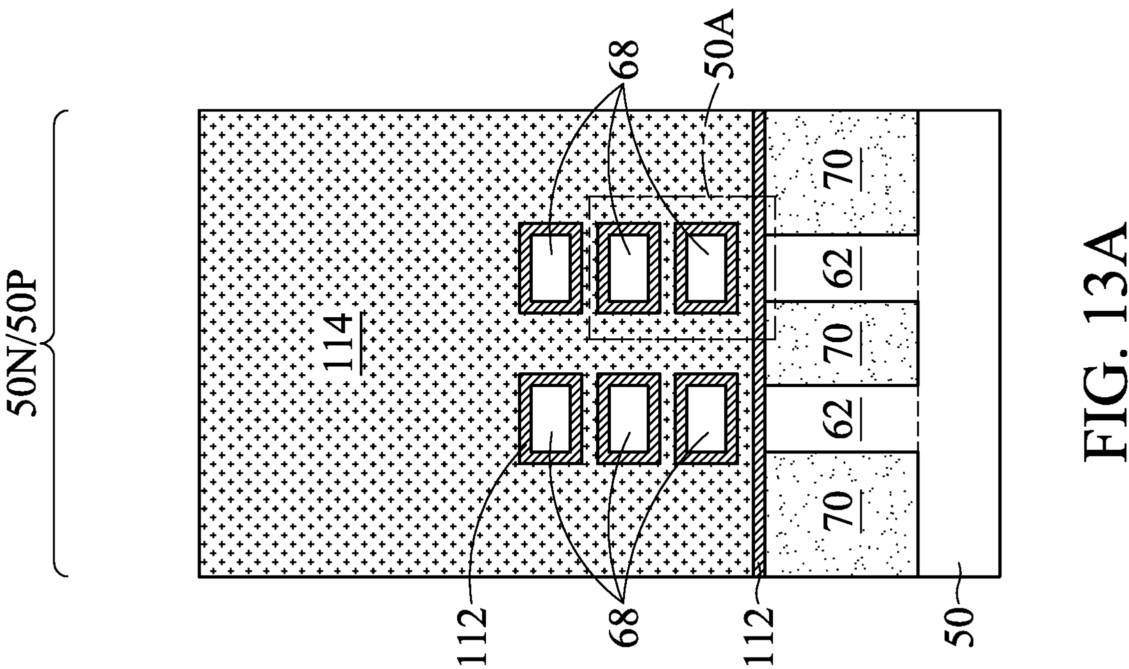

In FIGS. 13A-13B, a gate dielectric layer 112 is formed in the recesses 106 and the openings 108. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a high-dielectric constant (high-k) material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 13A-13B, as will be subsequently described in greater detail, the gate dielectric layer 112 may include multiple layers, such as an interfacial layer and a high-k dielectric layer.

The gate electrode layer 114 may include one or more metal-containing material(s) such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A-13B, as will be subsequently described in greater detail, the gate electrode layer 114 may include any number of work function tuning layers, any number of glue layers, and a fill layer.

The formation of the gate dielectric layers 112 in the n-type region 50N and the p-type region 50P may occur simultaneously such that the gate dielectric layers 112 in each region are formed of the same materials, and the formation of the gate electrode layers 114 in the n-type region 50N and the p-type region 50P may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes. In the following description, at least portions of the gate electrode layers 114 in the n-type region 50N and the gate electrode layers 114 in the p-type region 50P are formed separately.

FIGS. 14A-18B illustrate a process in which a gate dielectric layer 112 and a gate electrode layer 114 for replacement gates are formed in the recesses 106 and the openings 108 in the p-type region 50P. FIGS. 14A, 15A, 16A, 17A, and 18A illustrate features in a region 50A in FIG. 13A. FIGS. 14B, 15B, 16B, 17B, and 18B illustrate features in a region 50B in FIG. 13B. The gate dielectric layer 112 is formed on/around the channel regions 68 (see FIGS. 14A-14B). A p-type work function tuning layer 114A for the gate electrode layer 114 is formed on the gate dielectric layer 112 (see FIGS. 15A-15B). A capping layer 116 is formed on the p-type work function tuning layer 114A (see FIGS. 16A-16B). Advantageously, the capping layer 116 is formed of a sacrificial material which provides good protection to the underlying p-type work function tuning layer 114A, and which is capable of being formed by a deposition process with a high degree of conformality, such as atomic layer deposition. An anneal process is performed while the capping layer 116 covers the p-type work function tuning layer 114A, which drives a work function tuning element from the p-type work function tuning layer 114A into the gate dielectric layer 112 so as to tune the work functions of the resulting nano-FETs. After the anneal process, the capping layer 116 is removed to expose the p-type work function tuning layer 114A (see FIGS. 17A-17B). Remaining layers for the gate electrode layer 114, such as a glue layer 114C and a fill layer 114D, may then be formed on the p-type work function tuning layer 114A (see FIGS. 18A-18B). The n-type region 50N may be masked at least while forming portions of the gate electrode layer 114 in the p-type region 50P.

Figure 14B:
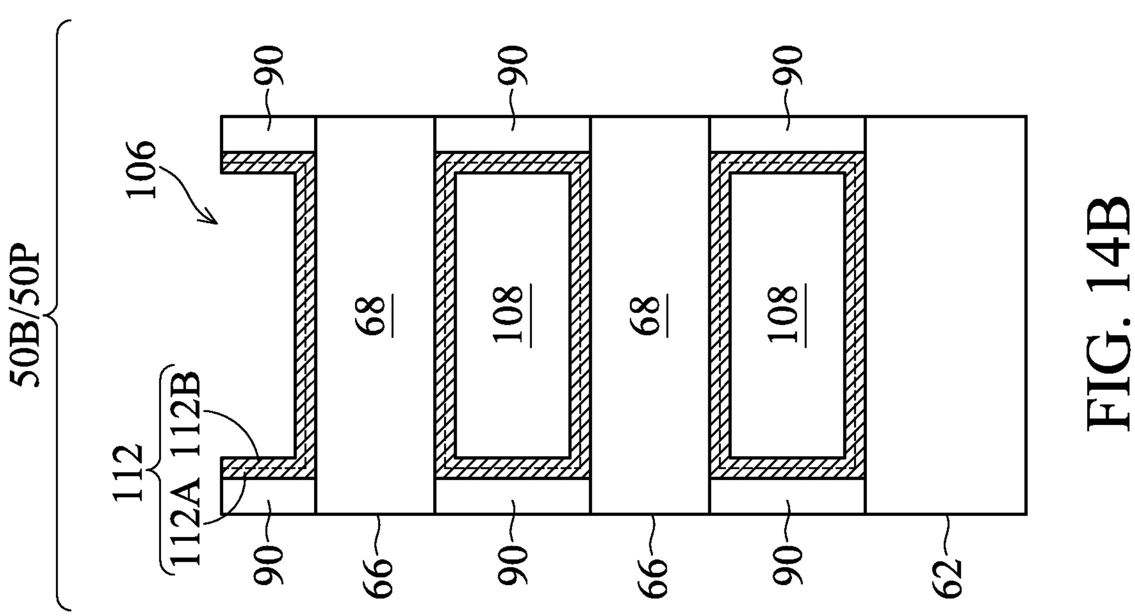
Figure 14A:
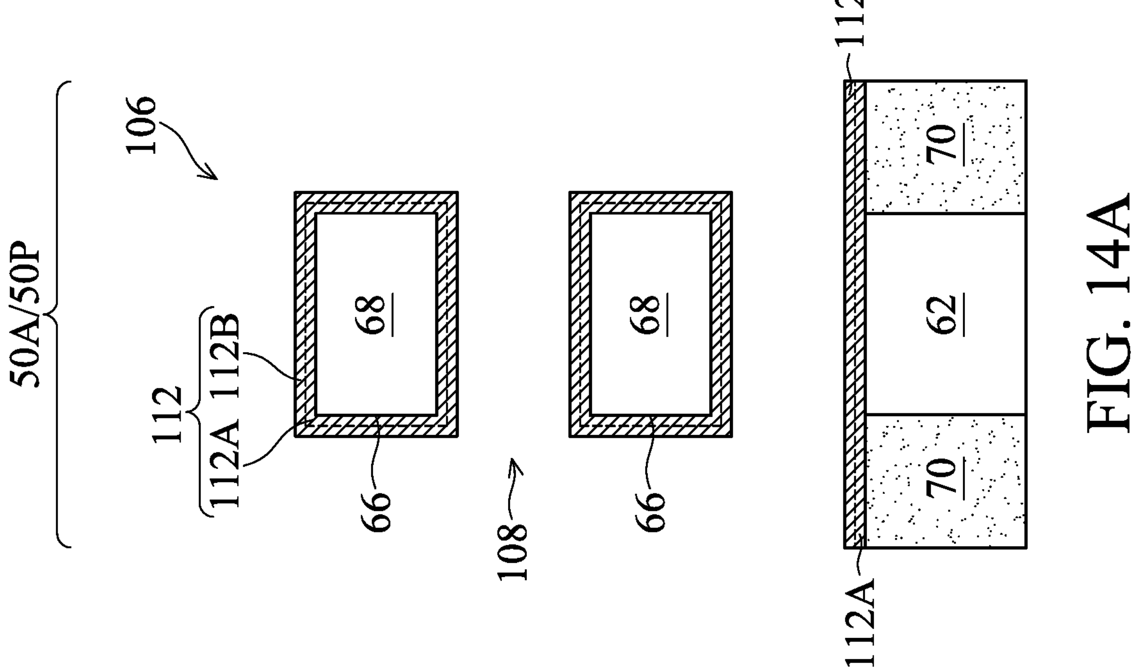

In FIGS. 14A-14B, the gate dielectric layer 112 is conformally formed on the channel regions 68 of the second nanostructures 66, such that it conformally lines the recesses 106 and the openings 108 in the p-type region 50P. The gate dielectric layer 112 may also be deposited on the top surfaces of the first ILD 104 and the gate spacers 90 (see FIG. 13B). The formation methods of the gate dielectric layer 112 may include molecular-beam deposition (MBD), ALD, PECVD, and the like. The gate dielectric layer 112 wraps around all (e.g., four) sides of the second nanostructures 66. In some embodiments, the gate dielectric layer 112 has a thickness in the range of 10 Å to 30 Å. In the illustrated embodiment, the gate dielectric layer 112 is multi-layered, including an interfacial layer 112A (or more generally, a first gate dielectric sub-layer) and an overlying high-k dielectric layer 112B (or more generally, a second gate dielectric sub-layer). The interfacial layer 112A may be formed of silicon oxide and the high-k dielectric layer 112B may be formed of hafnium oxide. The gate dielectric layer 112 may include any acceptable number of sub-layers.

Figure 15B:
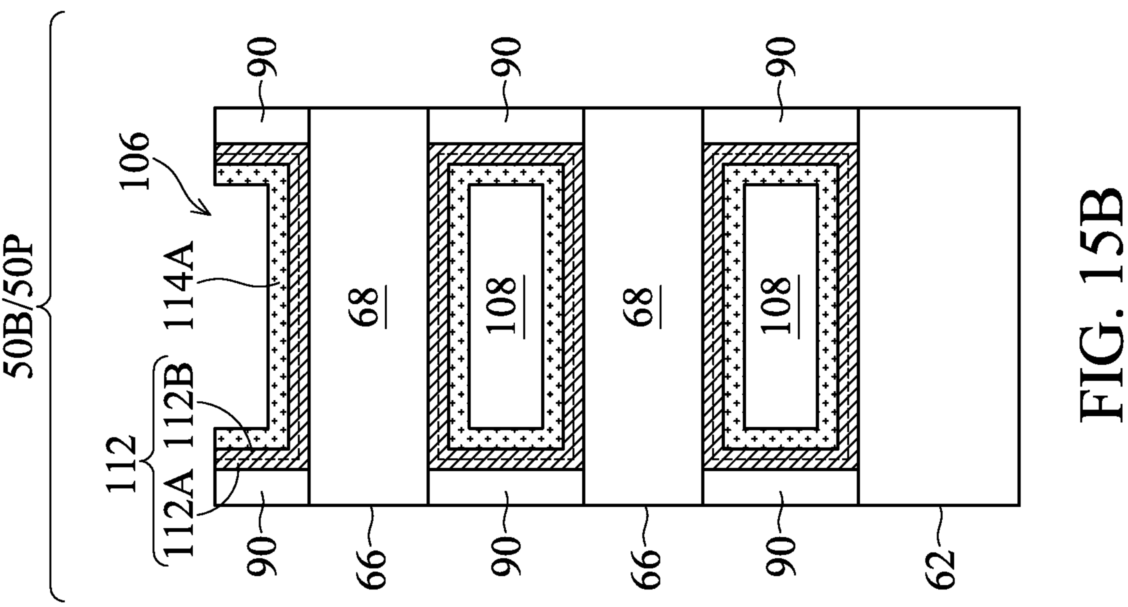
Figure 15A:
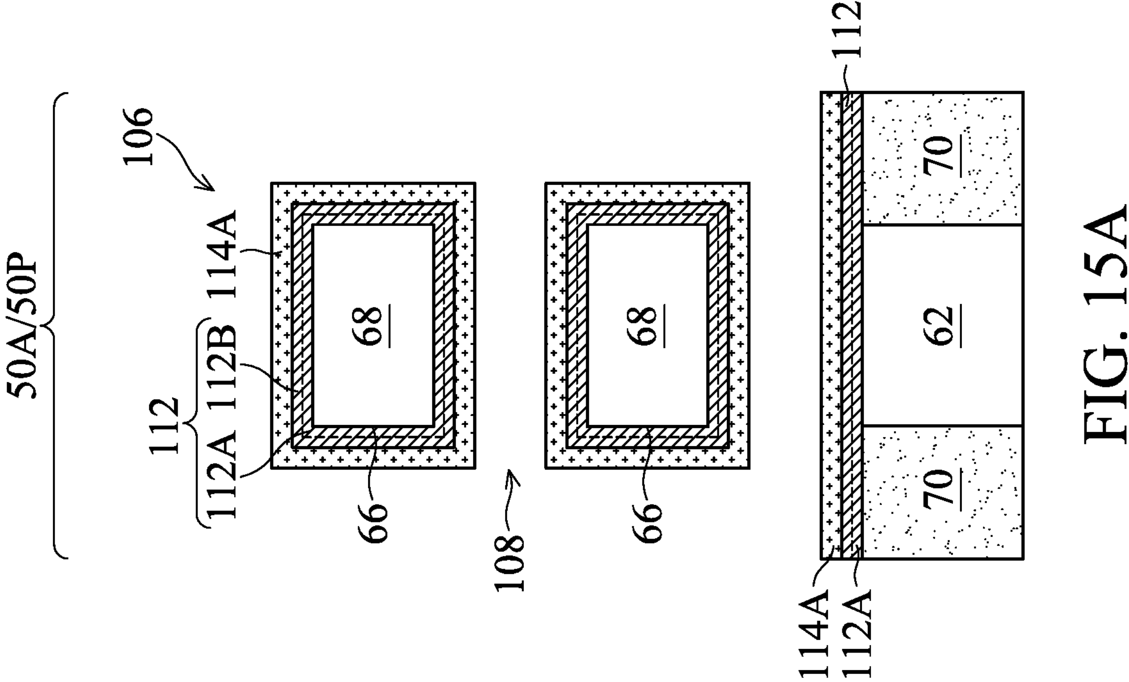

In FIGS. 15A-15B, a p-type work function tuning layer 114A is conformally formed on the gate dielectric layer 112, such that it conformally lines the recesses 106 and the openings 108 in the p-type region 50P. The p-type work function tuning layer 114A is formed of a p-type work function material (PWFM) that is acceptable to tune a work function of a nano-FET to a desired amount given the application of the device to be formed, and may be formed by any acceptable deposition process. In some embodiments, the p-type work function tuning layer 114A is formed of titanium nitride, tantalum nitride, combinations thereof, or the like, which may be formed by a deposition process such as PVD, ALD, CVD, or the like. In some embodiments, the p-type work function tuning layer 114A has a thickness in the range of 10 Å to 30 Å. The PWFM of the p-type work function tuning layer 114A includes a work function tuning element which will be subsequently driven into the gate dielectric layer 112 so as to tune the work functions of the resulting nano-FETs. The work function tuning element may be a metal, and the PWFM may be a nitride of that metal. In some embodiments, the work function tuning element is titanium, the PWFM is titanium nitride, and the p-type work function tuning layer 114A is deposited by PVD.

Figure 16B:
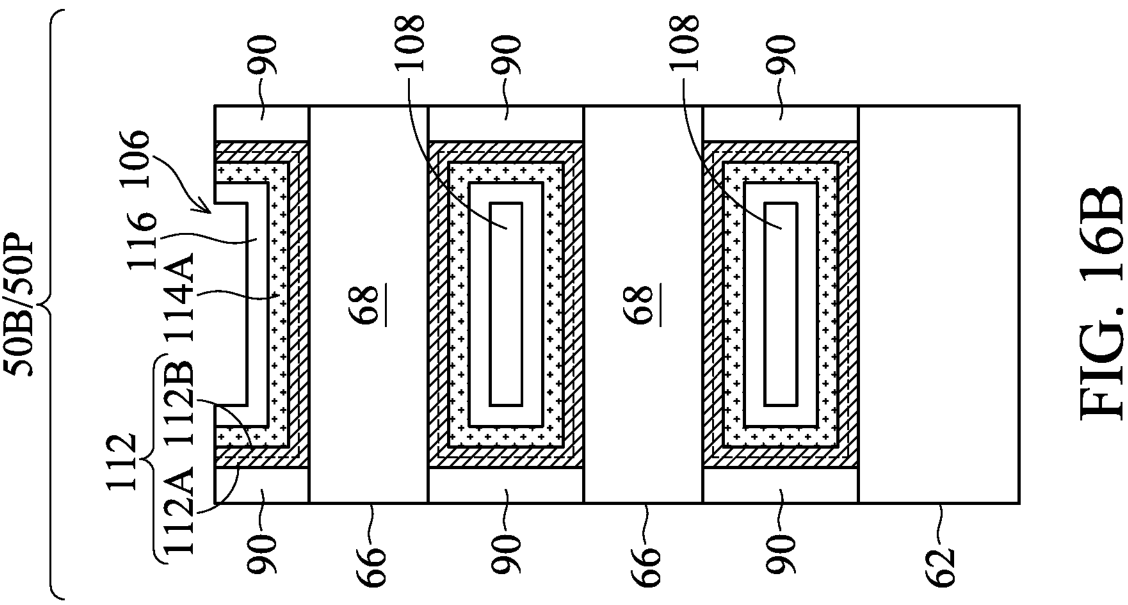
Figure 16A:
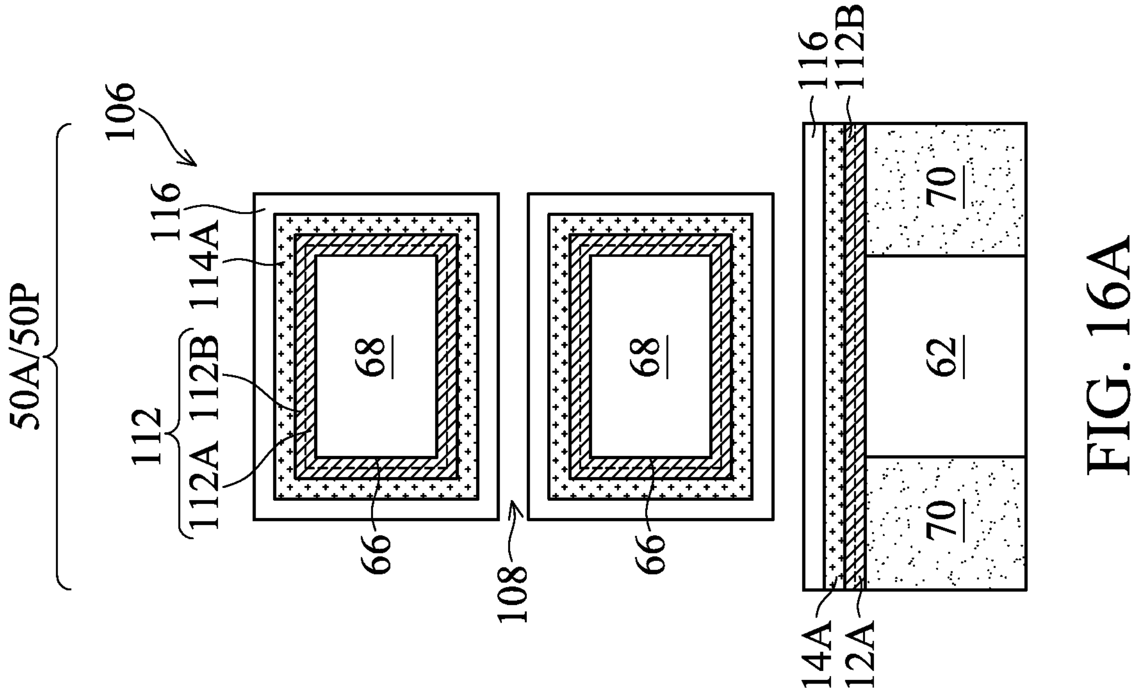

In FIGS. 16A-16B, a capping layer 116 is conformally formed on the p-type work function tuning layer 114A, such that it conformally lines the recesses 106 and the openings 108 in the p-type region 50P. As will be subsequently described in greater detail, the capping layer 116 is formed of a sacrificial material which is capable of being formed by a deposition process with a high degree of conformality, such as atomic layer deposition, thereby allowing the capping layer 116 to have a high degree of conformality. The deposition process for forming the capping layer 116 may be a different type of deposition process than the deposition process for forming the p-type work function tuning layer 114A. The capping layer 116 is a sacrificial layer that will be used to protect the p-type work function tuning layer 114A during a subsequent anneal process. The capping layer 116 will then be removed so that it does not remain in the resulting nano-FETs. As noted above, the openings 108 are small. The capping layer 116 is formed to a small thickness, so that it does not merge or seam together in the openings 108 or the recesses 106. Avoiding merging or seaming of the capping layer 116 advantageously allows the capping layer 116 to be removed with an etch process performed with a small amount of over-etching, which decreases the risk of damage to the underlying features, thereby increasing manufacturing yield. In some embodiments, the capping layer 116 has a thickness in the range of 10 Å to 100 Å. Forming the capping layer 116 with a thickness less than 10 Å may not provide sufficient protection to the p-type work function tuning layer 114A during the subsequent anneal process, resulting in damage to the p-type work function tuning layer 114A. Forming the capping layer 116 with a thickness greater than 100 Å may cause undesirable merging or seaming. The thickness of the capping layer 116 may be greater than the thickness of the p-type work function tuning layer 114A and the thickness of the gate dielectric layer 112.

The capping layer 116 is formed of a sacrificial material which has good oxidation resistance and acts as a good moisture barrier at small thicknesses. The sacrificial material may be an oxide, a nitride, combinations thereof, multilayers thereof, or the like. Suitable oxides include aluminum oxide, silicon oxide, and the like. Suitable nitrides include titanium nitride, silicon nitride, silicon carbonitride, and the like. A combination of such materials (e.g., an oxynitride) may also be used. The sacrificial material may be conductive or non-conductive. In some embodiments, the sacrificial material is a dielectric material. At small thicknesses, such sacrificial materials have better oxidation resistance and act as a better moisture barrier than other sacrificial materials such as amorphous silicon. Further, unlike other sacrificial materials such as amorphous silicon, the sacrificial material of the capping layer 116 is capable of being deposited by ALD, which has a higher degree of conformality than other deposition processes such as chemical vapor deposition (CVD). Depositing the sacrificial material with a high degree of conformality can help avoid merging or seaming of the capping layer 116. Further still, and as will be subsequently described in greater detail, the sacrificial material may also include a work function tuning element, which also allows the capping layer 116 to be utilized to tune the work functions of the resulting nano-FETs.

In some embodiments, the capping layer 116 is an aluminum oxide layer, which is formed by depositing aluminum oxide with an atomic layer deposition (ALD) process. The ALD process is performed by placing the substrate 50 in a deposition chamber and cyclically dispensing multiple source precursors into the deposition chamber, thus exposing the surfaces of the p-type work function tuning layer 114A to the source precursors. The source precursors include a first precursor and a second precursor, which are any acceptable precursors capable of reacting to deposit the sacrificial material of the capping layer 116. In some embodiments, the first precursor is an aluminum-containing precursor and the second precursor is an oxygen-containing precursor. Acceptable aluminum-containing precursors for depositing aluminum oxide include trimethylaluminum ($Al_2(CH_3)_6$) and the like. Acceptable oxygen-containing precursors for depositing aluminum oxide include water ($H_2O$) and the like. Other acceptable precursors may be used. A first pulse of an ALD cycle is performed by dispensing the first precursor (e.g., an aluminum-containing precursor such as trimethylaluminum) into the deposition chamber. The first precursor is kept in the deposition chamber until the first precursor has reacted with the available reactive sites on the surfaces of the p-type work function tuning layer 114A. The first precursor is then purged from the deposition chamber, such as by any acceptable vacuuming process and/or by flowing an inert gas into the deposition chamber. A second pulse of the ALD cycle is performed by dispensing the second precursor (e.g., an oxygen-containing precursor such as water) into the deposition chamber. The second precursor is kept in the deposition chamber until the second precursor has reacted with the available reactive sites on the surfaces of the p-type work function tuning layer 114A. The second precursor is then purged from the deposition chamber, such as by any acceptable vacuuming process and/or by flowing an inert gas into the deposition chamber. Each ALD cycle results in the deposition of an atomic layer (sometimes called a monolayer) of the sacrificial material of the capping layer 116. The ALD cycle is repeated a number of times, until the sacrificial material of the capping layer 116 is deposited to a desired thickness (previously described). Other suitable ALD-like processes may also be utilized to deposit the sacrificial material of the capping layer 116.

Optionally, the sacrificial material of the capping layer 116 includes a work function tuning element which will be subsequently driven into the gate dielectric layer 112 so as to tune the work functions of the resulting nano-FETs. The work function tuning element may be a metal, and the sacrificial material may be an oxide of that metal or a nitride of that metal. In some embodiments, the work function tuning element is aluminum and the sacrificial material is aluminum oxide. The sacrificial material of the capping layer 116 may include the same work function tuning element as the PWFM of the p-type work function tuning layer 114A (previously described), or may include a different work function tuning element. In some embodiments, the work function tuning element of the p-type work function tuning layer 114A is titanium and the work function tuning element of the capping layer 116 is aluminum. The work functions of the resulting nano-FETs may thus be tuned by selection of the materials of the capping layer 116 and the p-type work function tuning layer 114A.

After the capping layer 116 is formed, the capping layer 116, the p-type work function tuning layer 114A, and the gate dielectric layer 112 are annealed to drive the work function tuning element(s) from the capping layer 116 and/or the p-type work function tuning layer 114A into the gate dielectric layer 112, thereby tuning the work functions of the resulting nano-FETs. The anneal process may be a rapid thermal anneal, a spike anneal, or the like. The anneal process may be performed at a temperature in the range of 500° C. to 1000° C. and for a duration in the range of 1 millisecond to 5 minutes. The anneal process may be performed in an environment containing a process gas, such as an oxygen-containing process gas, a nitrogen-containing process gas, or the like. In some embodiments, the anneal process is performed in-situ with the ALD process used to form the sacrificial material of the capping layer 116. Specifically, the anneal process may be performed in the deposition chamber for the ALD process, without breaking a vacuum in the deposition chamber between the ALD process and the anneal process.

As noted above, the sacrificial material of the capping layer 116 has good oxidation resistance and acts as a good moisture barrier. Because the sacrificial material has good oxidation resistance, it impedes (e.g., prevents or reduces) oxidation of underlying features during the anneal process. For example, the capping layer 116 can impede oxidation of the fins 62, the second nanostructures 66, the gate dielectric layer 112, and/or the p-type work function tuning layer 114A during the anneal process. Further, because the sacrificial material acts as a good moisture barrier, it impedes moisture in the environment of the anneal process from entering into the interfaces of the fins 62, the second nanostructures 66, the gate dielectric layer 112, and/or the p-type work function tuning layer 114A during the anneal process. Delamination of those features may thus be avoided. Avoiding oxidation and delamination of the features may reduce the formation of defects, increasing the performance of the resulting nano-FETs.

Figure 17B:
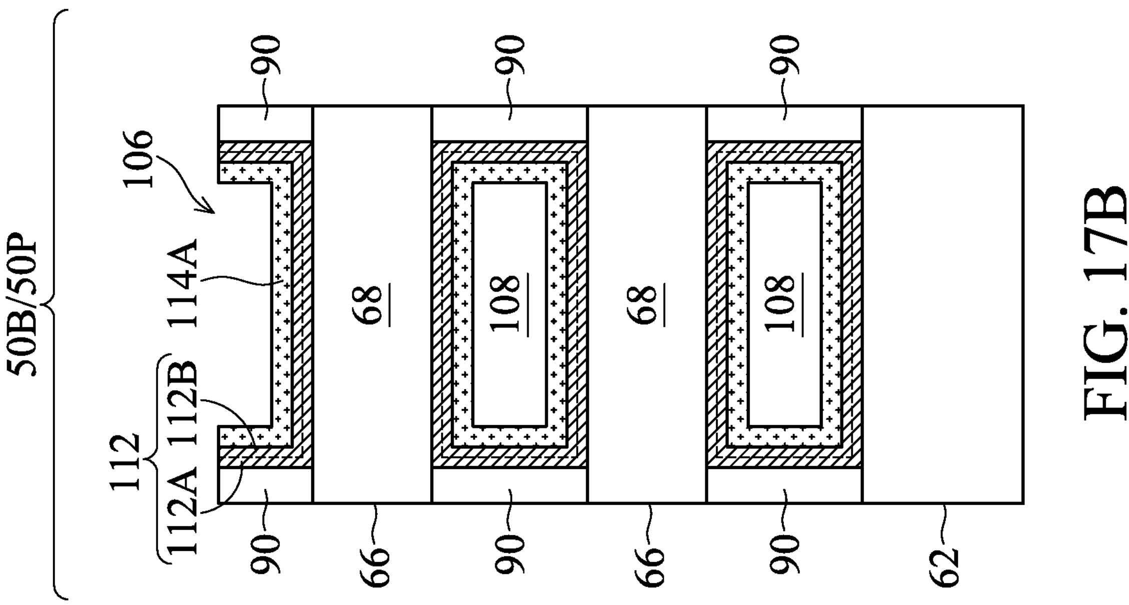
Figure 17A:
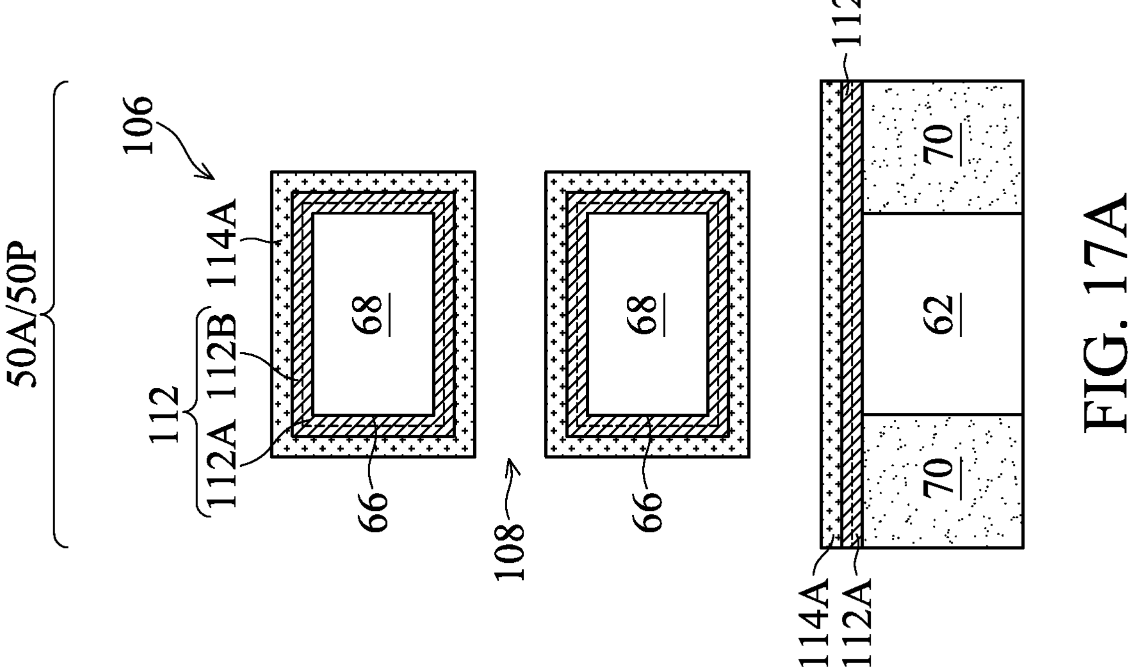

In FIGS. 17A-17B, the capping layer 116 is removed to expose the p-type work function tuning layer 114A. The capping layer 116 may be removed with any acceptable etch process, such as one that is selective to the capping layer 116 (e.g., selectively etches the sacrificial material of the capping layer 116 at a faster rate than the material of the p-type work function tuning layer 114A). The etch process may be isotropic. In some embodiments, the capping layer 116 is removed by a dry etch using carbon tetrafluoride ($CF_4$), nitrogen trifluoride ($NF_3$), boron trichloride ($BCl_3$), or the like without generating a plasma. In some embodiments, the capping layer 116 is removed by a wet etch using phosphoric acid ($H_3PO_4$), ammonium hydroxide ($NH_4OH$), hydrogen chloride (HCl), sulfuric acid ($H_2SO_4$), hydrogen peroxide ($H_2O_2$), nitric acid ($HNO_3$), or the like. Timed etch processes may be used to stop the etching once the capping layer 116 has been removed. In some embodiments, the etch process is performed for a duration in the range of 30 seconds to 300 seconds. As noted above, the capping layer 116 is formed to a small thickness to help avoid merging or seaming of the capping layer 116 in the openings 108 or the recesses 106. Avoiding merging or seaming of the capping layer 116 advantageously allows the etch process to be performed with a small amount of over-etching, which decreases the risk of damage to the underlying features (e.g., the gate dielectric layer 112 and/or the p-type work function tuning layer 114A). Avoiding damage to those features may increase manufacturing yield of the resulting nano-FETs.

Figure 18B:
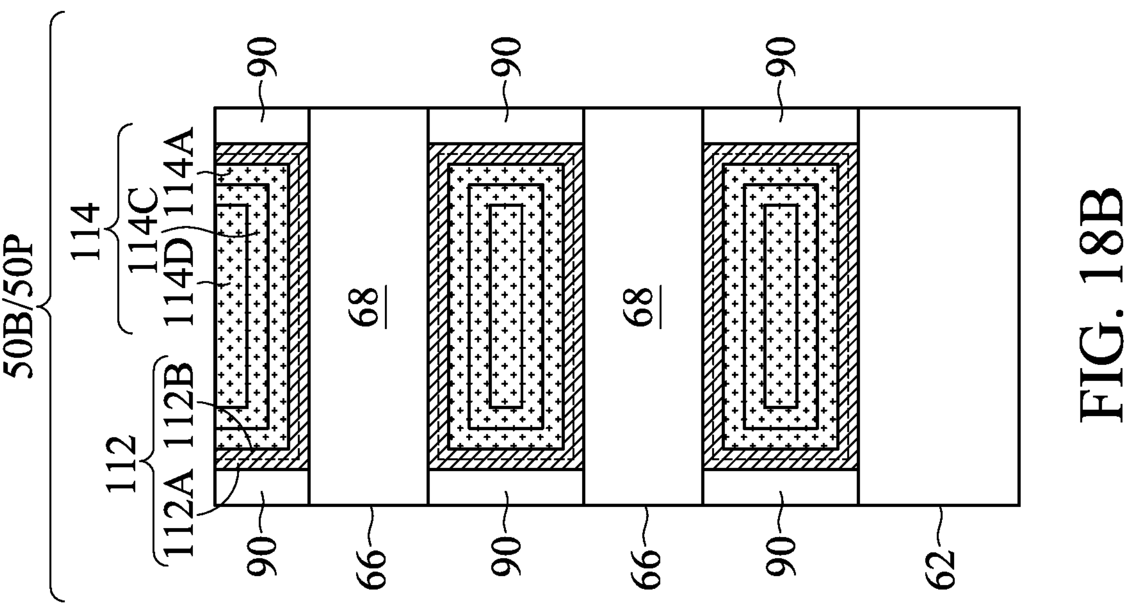
Figure 18A:
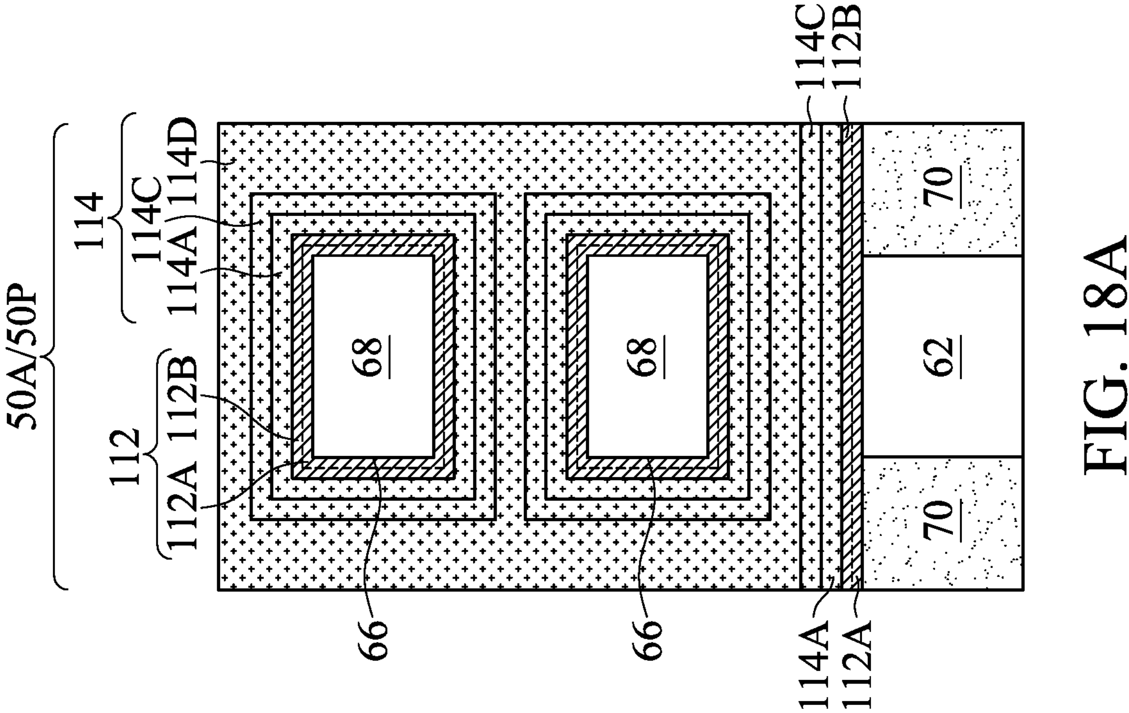

In FIGS. 18A-18B, the remaining portions of the gate electrode layer 114 are formed on the p-type work function tuning layer 114A, thereby filling the remaining portions of the recesses 106 and the openings 108 in the p-type region 50P. In the illustrated embodiment, a glue layer 114C is deposited on the p-type work function tuning layer 114A, and a fill layer 114D is deposited on the glue layer 114C. After formation is complete, the gate electrode layer 114 in the p-type region 50P include the p-type work function tuning layer 114A, the glue layer 114C, and the fill layer 114D.

The glue layer 114C may be conformally formed on the p-type work function tuning layer 114A. The glue layer 114C may be formed of a conductive material such as titanium nitride, tantalum nitride, titanium carbide, tantalum carbide, or the like, which may be formed by a deposition process such as CVD, ALD, PECVD, PVD, or the like. The glue layer 114C may alternately be referred to as an adhesion layer and improves adhesion between the p-type work function tuning layer 114A and the fill layer 114D.

The fill layer 114D may be conformally formed on the glue layer 114C. In some embodiments, the fill layer 114D may be formed of a conductive material such as cobalt, ruthenium, aluminum, tungsten, combinations thereof, or the like, which may be formed by a deposition process such as CVD, ALD, PECVD, PVD, or the like. The fill layer 114D fills the remaining portions of the recesses 106 and the openings 108 in the p-type region 50P.

Figure 19B:
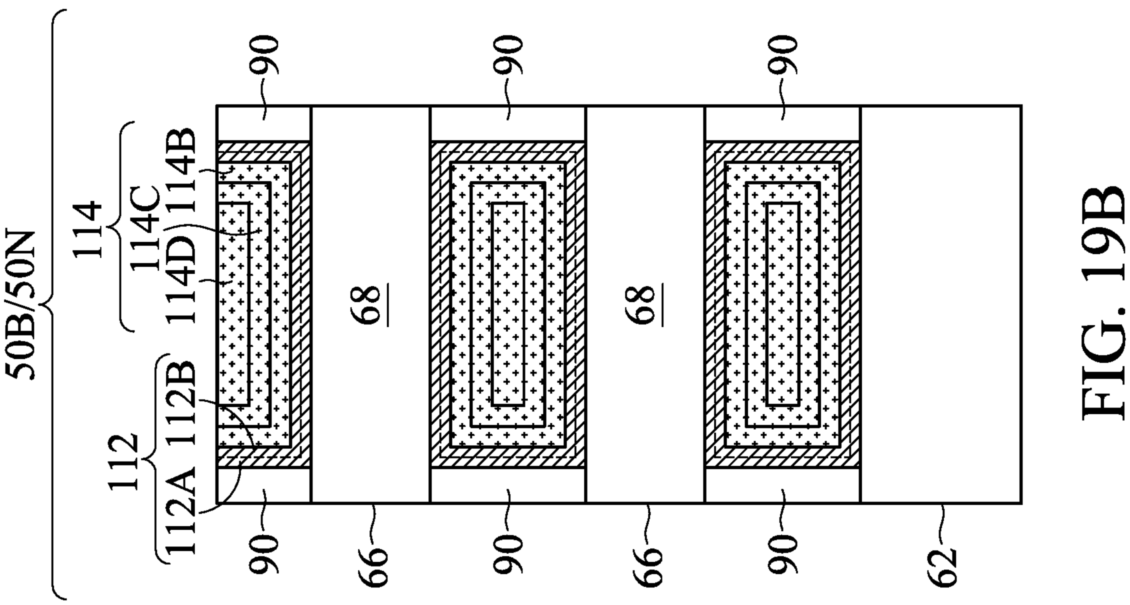
Figure 19A:
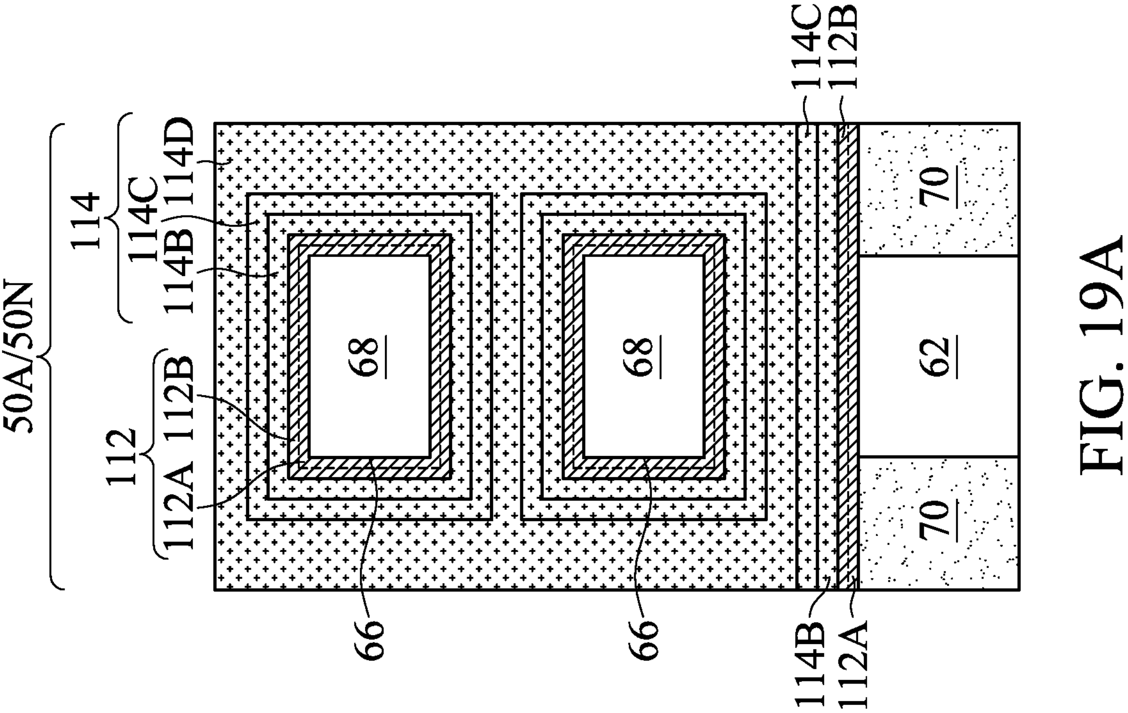

FIGS. 19A-19B illustrate a gate dielectric layer 112 and a gate electrode layer 114 for replacement gates, which are formed in the recesses 106 and the openings 108 in the n-type region 50N. FIG. 19A illustrates features in a region 50A in FIG. 13A. FIG. 19B illustrates features in a region 50B in FIG. 13B. In some embodiments, the gate dielectric layers 112 in the n-type region 50N and the p-type region 50P may be formed simultaneously. Further, at least portions of the gate electrode layer 114 in the n-type region 50N may be formed either before or after forming the gate electrode layer 114 in the p-type region 50P, and the p-type region 50P may be masked at least while forming portions of the gate electrode layer 114 in the n-type region 50N. As such, the gate electrode layer 114 in the n-type region 50N may include different materials than the gate electrode layer 114 in the p-type region 50P. For example, the gate electrode layer 114 in the n-type region 50N may include an n-type work function tuning layer 114B, a glue layer 114C, and a fill layer 114D. The n-type work function tuning layer 114B is formed of an n-type work function material (NWFM) that is acceptable to tune a work function of a nano-FET to a desired amount given the application of the device to be formed, and may be formed by any acceptable deposition process. In some embodiments, the n-type work function tuning layer 114B is formed of titanium aluminum, titanium aluminum carbide, tantalum aluminum, tantalum carbide, combinations thereof, or the like, which may be formed by a deposition process such as ALD, CVD, PVD, or the like. In some embodiments, the n-type work function tuning layer 114B has a thickness in the range of 10 Å to 50 Å. The n-type work function tuning layer 114B is formed of a different material than the p-type work function tuning layer 114A. The glue layer 114C in the n-type region 50N may (or may not) be formed of the same material as the glue layer 114C in the p-type region 50P, and may (or may not) be formed concurrently with the glue layer 114C in the p-type region 50P. The fill layer 114D in the n-type region 50N may (or may not) be formed of the same material as the fill layer 114D in the p-type region 50P, and may (or may not) be formed concurrently with the fill layer 114D in the p-type region 50P.

Figure 20B:
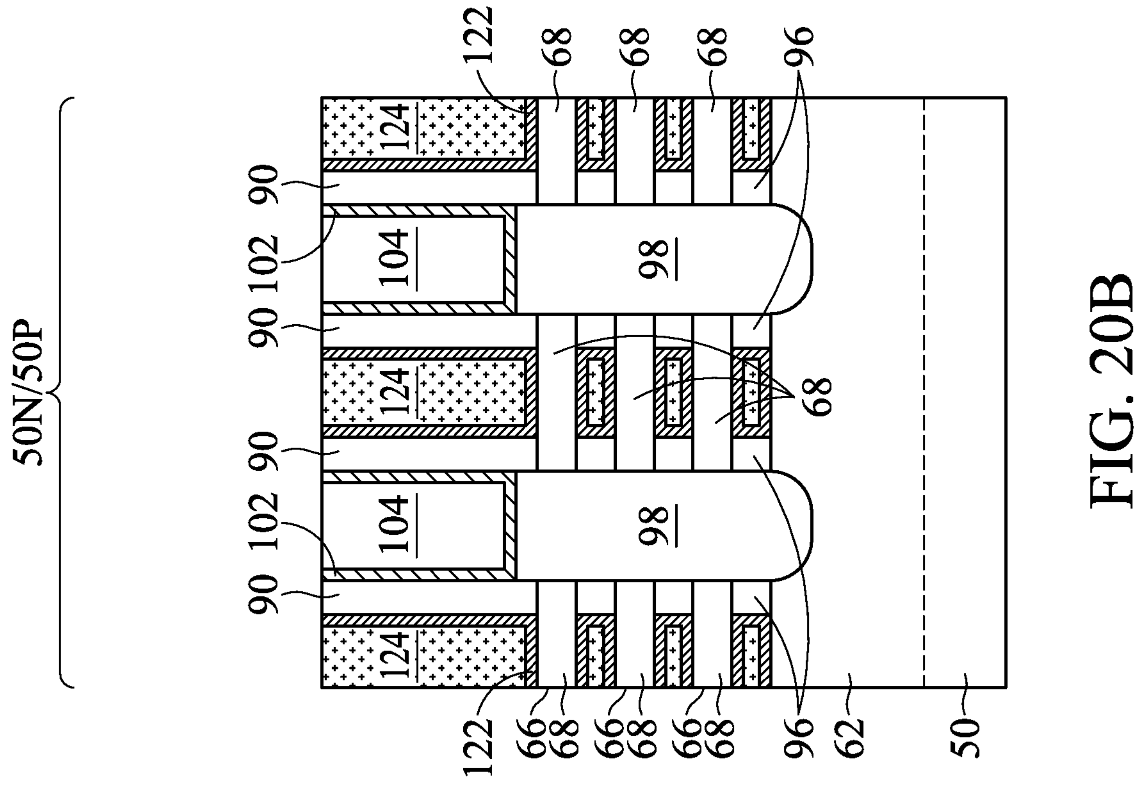
Figure 20A:
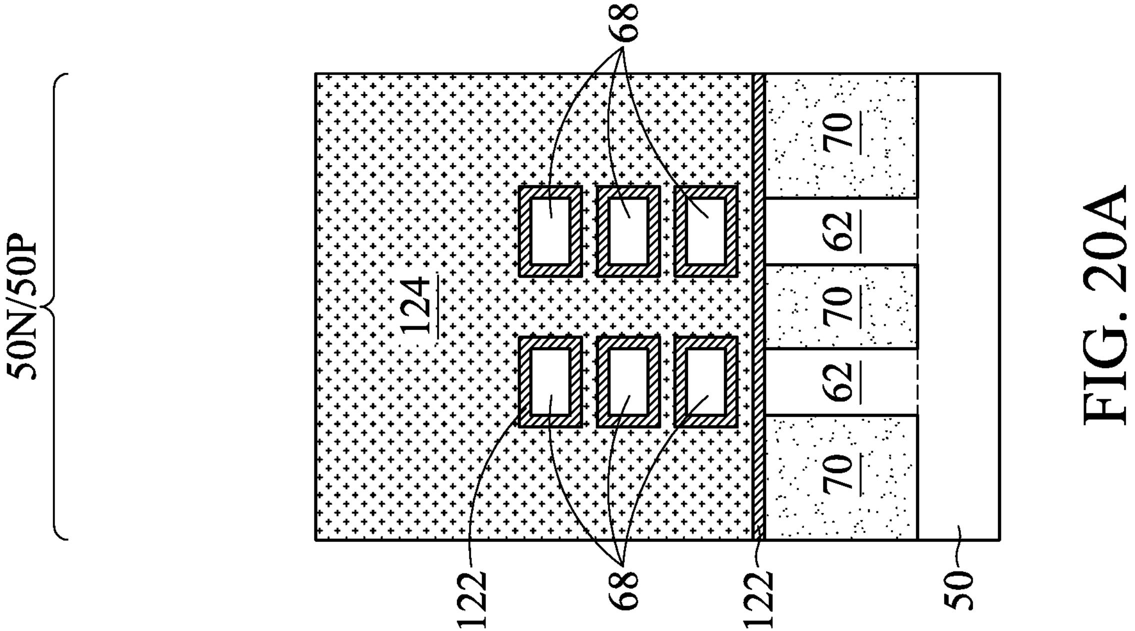

In FIGS. 20A-20B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 106 and the openings 108 (thus forming the gate dielectrics 122). The gate electrode layer 114, when planarized, has portions left in the recesses 106 and the openings 108 (thus forming the gate electrodes 124). The top surfaces of the gate spacers 90; the CESL 102; the first ILD 104; the gate dielectrics 122 (e.g., the interfacial layers 112A and the high-k dielectric layers 112B, see FIGS. 18A-19B); and the gate electrodes 124 (e.g., the p-type work function tuning layers 114A, the n-type work function tuning layers 114B, the glue layers 114C, and the fill layers 114D, see FIGS. 18A-19B) are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 21B:
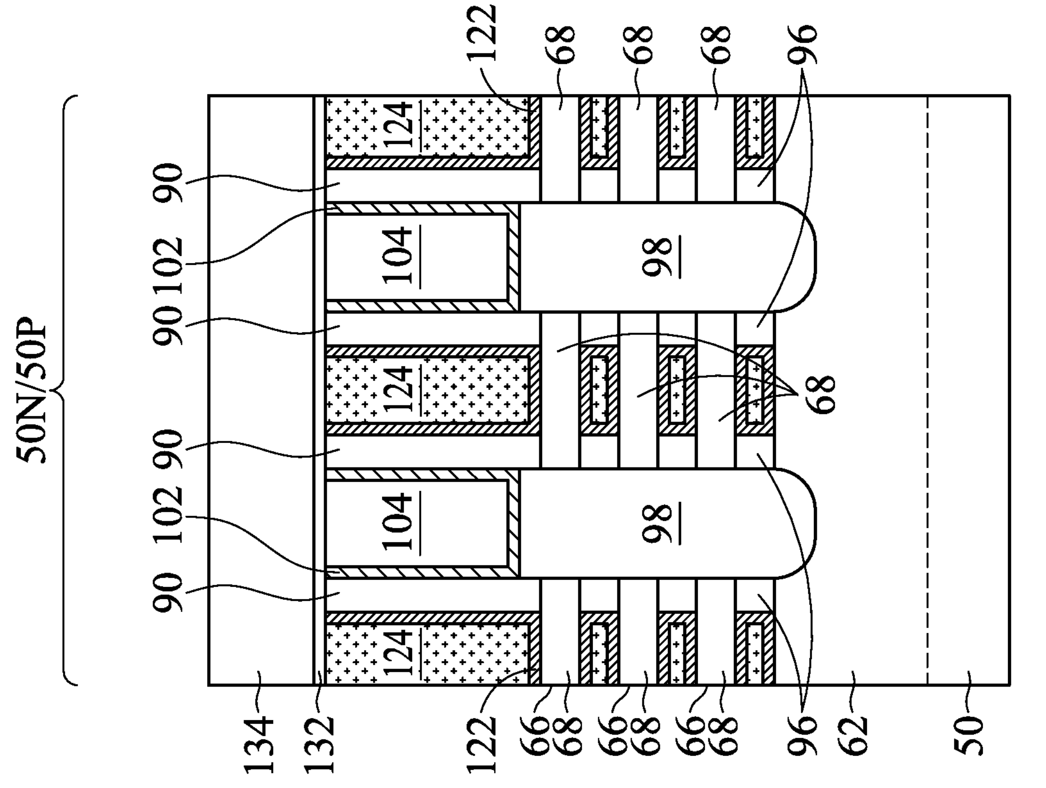
Figure 21A:
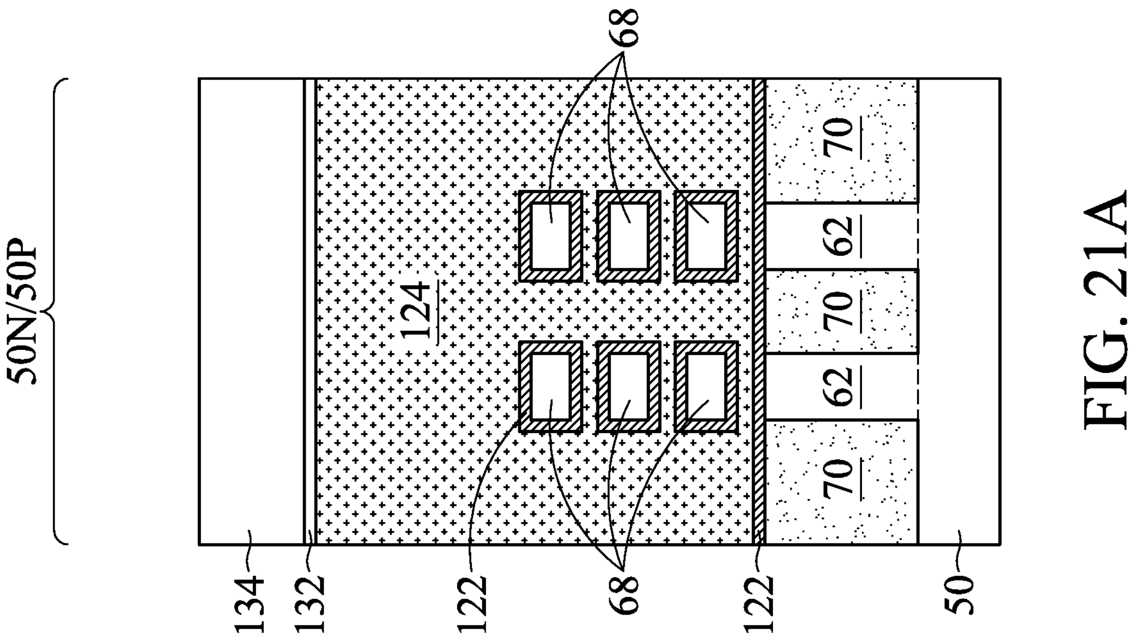

In FIGS. 21A-21B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be formed by any suitable deposition process, such as CVD, PECVD, or the like.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may be formed of a dielectric material having a high etching selectivity from the etching of the second ILD 134, such as silicon nitride, silicon oxide, silicon oxynitride, or the like, which may be formed by any suitable deposition process, such as CVD, ALD, or the like.

Figure 22B:
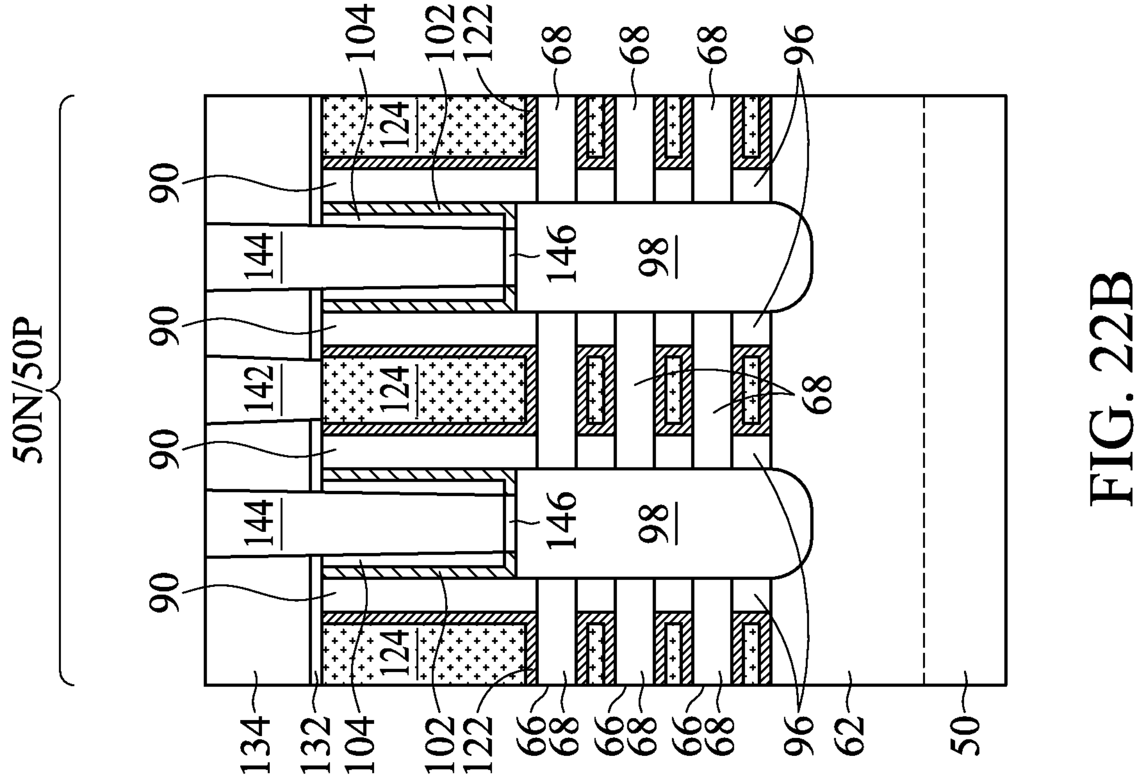
Figure 22A:
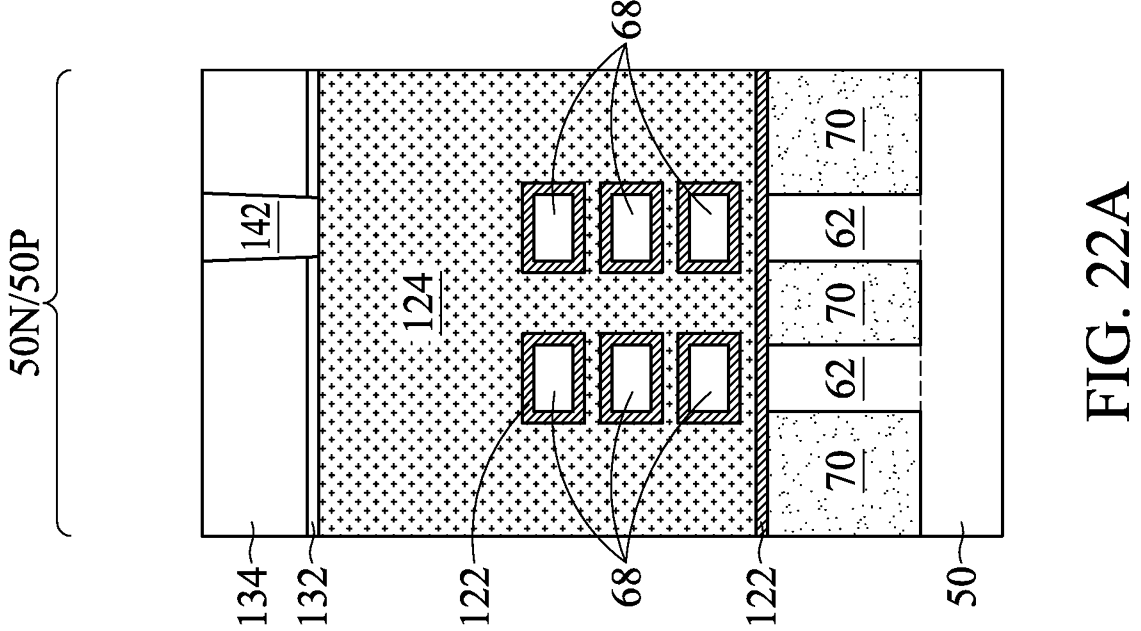

In FIGS. 22A-22B, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

Embodiments may achieve advantages. The capping layer 116 protects the underlying p-type work function tuning layer 114A during the anneal process for driving work function tuning element(s) into the gate dielectric layer 112. The capping layer 116 is formed to a small thickness (previously described), which can help avoid merging or seaming of the capping layer 116 in the openings 108 or the recesses 106. The capping layer 116 is formed of a sacrificial material which has better oxidation resistance and acts as a better moisture barrier than other sacrificial materials such as amorphous silicon, particularly at the small thickness of the capping layer 116. Further, unlike other sacrificial materials such as amorphous silicon, the sacrificial material of the capping layer 116 is capable of being formed by a deposition process with a high degree of conformality, such as ALD. Depositing the sacrificial material of the capping layer 116 with a high degree of conformality can also help avoid merging or seaming of the capping layer 116 in the openings 108 and the recesses 106. Avoiding merging or seaming of the capping layer 116 advantageously allows the capping layer 116 to be removed with an etch process performed with a small amount of over-etching, which decreases the risk of damage to underlying features (e.g., the gate dielectric layer 112 and/or the p-type work function tuning layer 114A). Avoiding damage to those features may increase manufacturing yield of the resulting nano-FETs.

FIGS. 23A-30B are views of intermediate stages in the manufacturing of FinFETs, in accordance with some embodiments. The FinFETs may be manufactured by a similar process as the nano-FETs previously described, except the nanostructures 64, 66 are omitted. Instead, the fins 62 are semiconductor features which act as channel regions 68 for the FinFETs. The gate structures (including the gate dielectrics 122 and the gate electrodes 124) are formed to extend along the top surfaces and the sidewalls of the channel regions 68 of the fins 62.

Figures 23A, 23B:
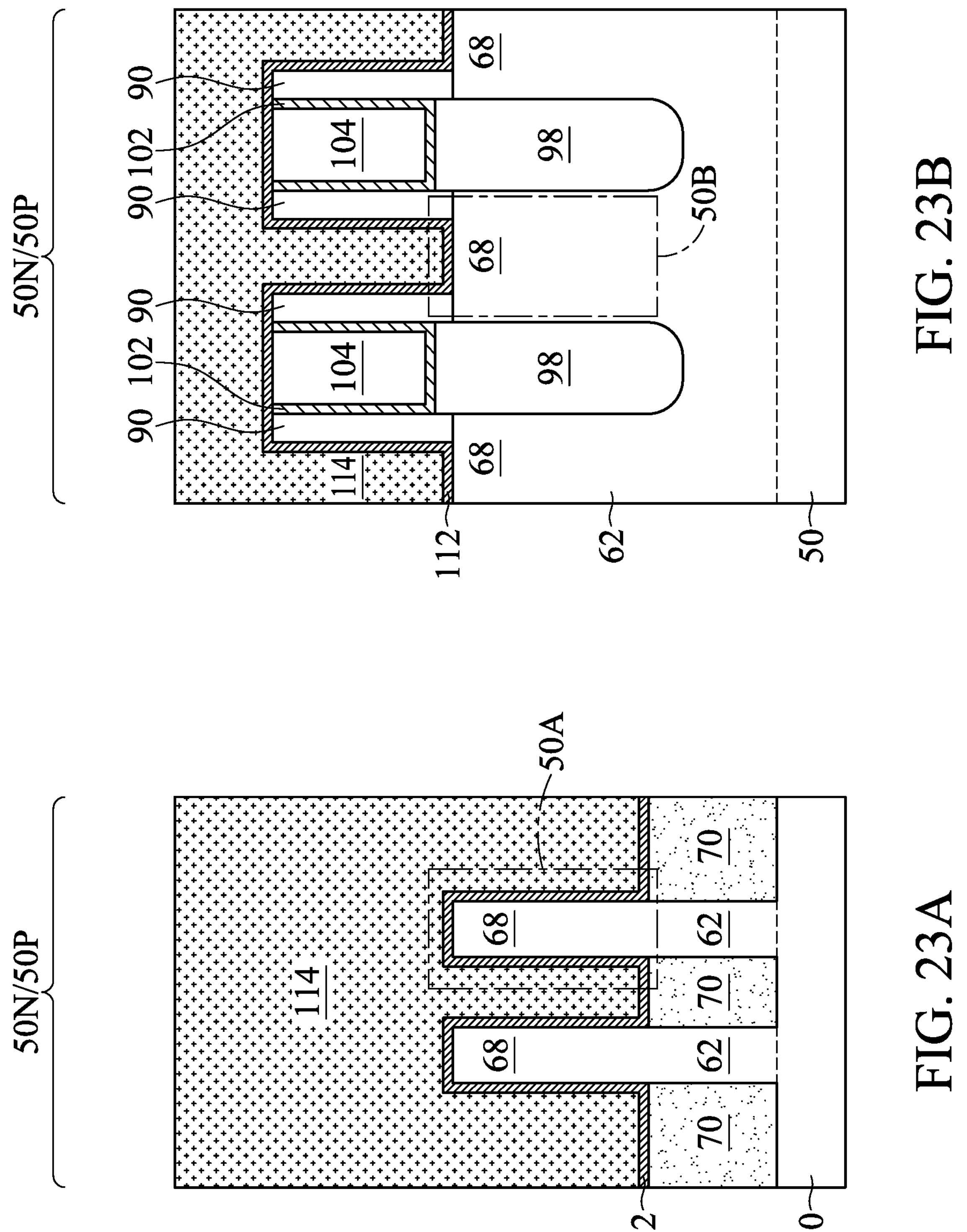

FIGS. 23A-23B show the FinFETs a similar stage of manufacturing as FIGS. 13A-13B. Because the nanostructures 64, 66 are omitted, the openings 108 are not present. Instead, the layers for replacement gates are formed on channel regions 68 of the fins 62. FIGS. 24A-28B illustrate a process in which a gate dielectric layer 112 and a gate electrode layer 114 for replacement gates are formed in the recesses 106 in the p-type region 50P.

Figure 24B:
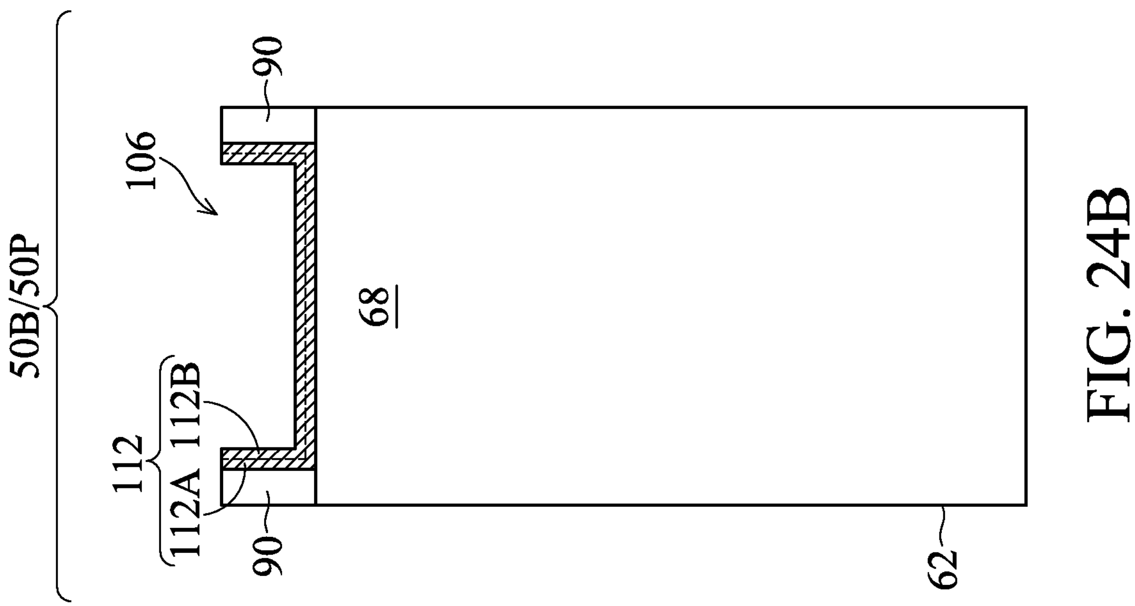
Figure 24A:
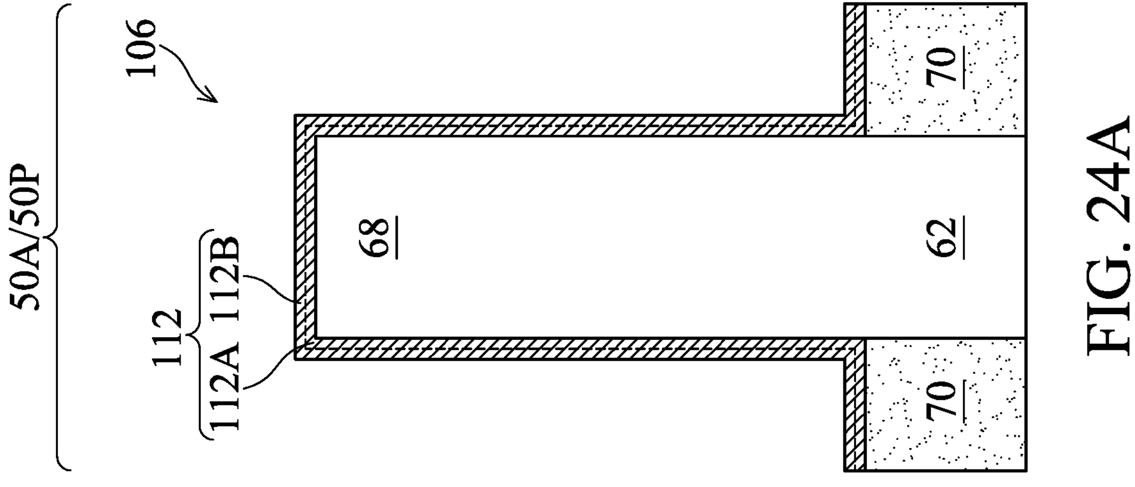

In FIGS. 24A-24B, the gate dielectric layer 112 is conformally formed on the channel regions 68 of the fins 62, such that it lines the recesses 106 in the p-type region 50P. The gate dielectric layer 112 may be formed in a similar manner as described for FIGS. 14A-14B.

Figure 25B:
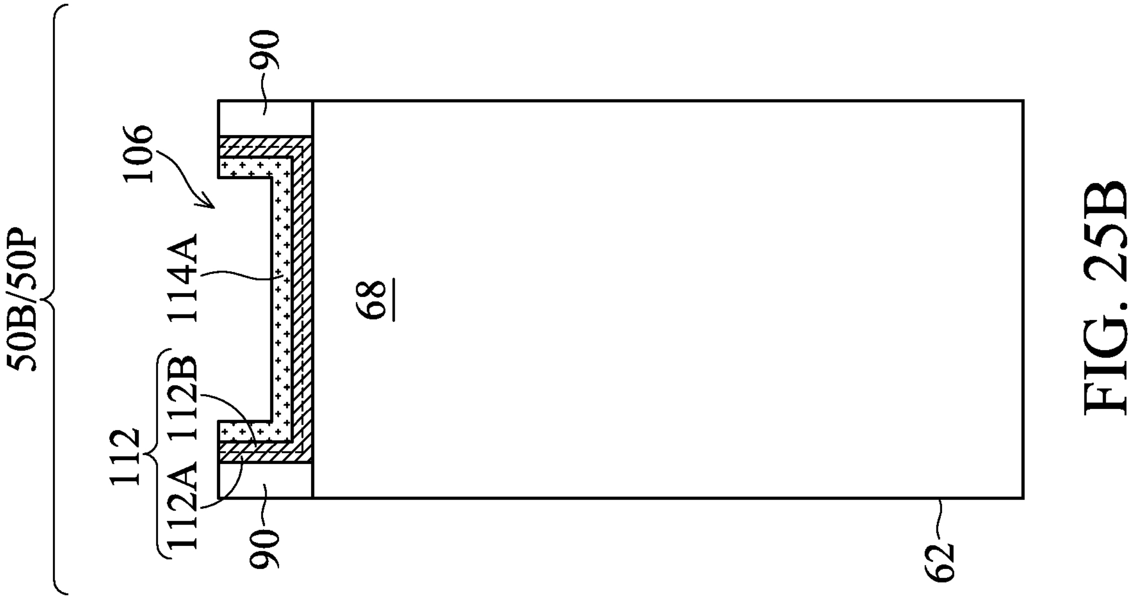
Figure 25A:
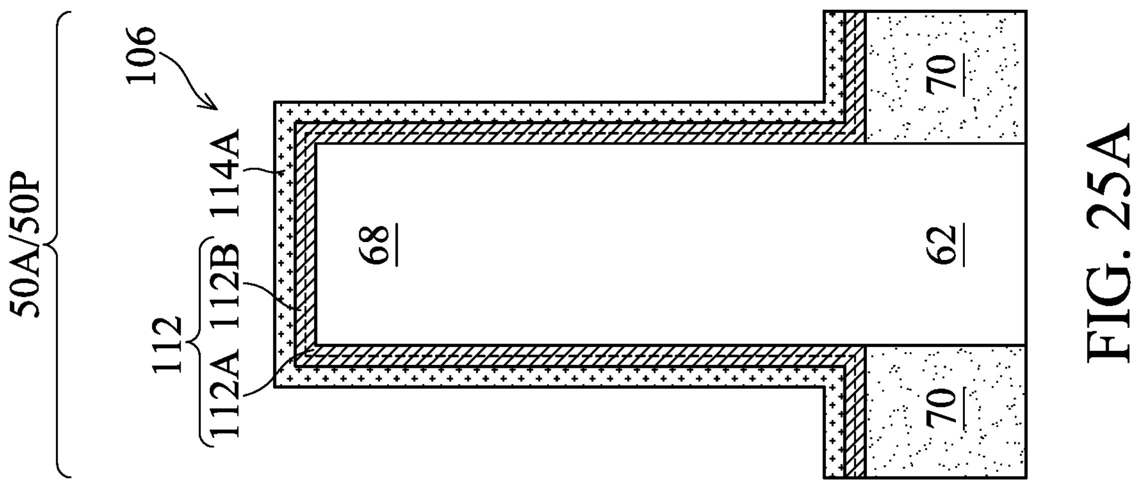

In FIGS. 25A-25B, a p-type work function tuning layer 114A is conformally formed on the gate dielectric layer 112, such that it lines the recesses 106 in the p-type region 50P. The p-type work function tuning layer 114A may be formed in a similar manner as described for FIGS. 15A-15B.

Figure 26B:
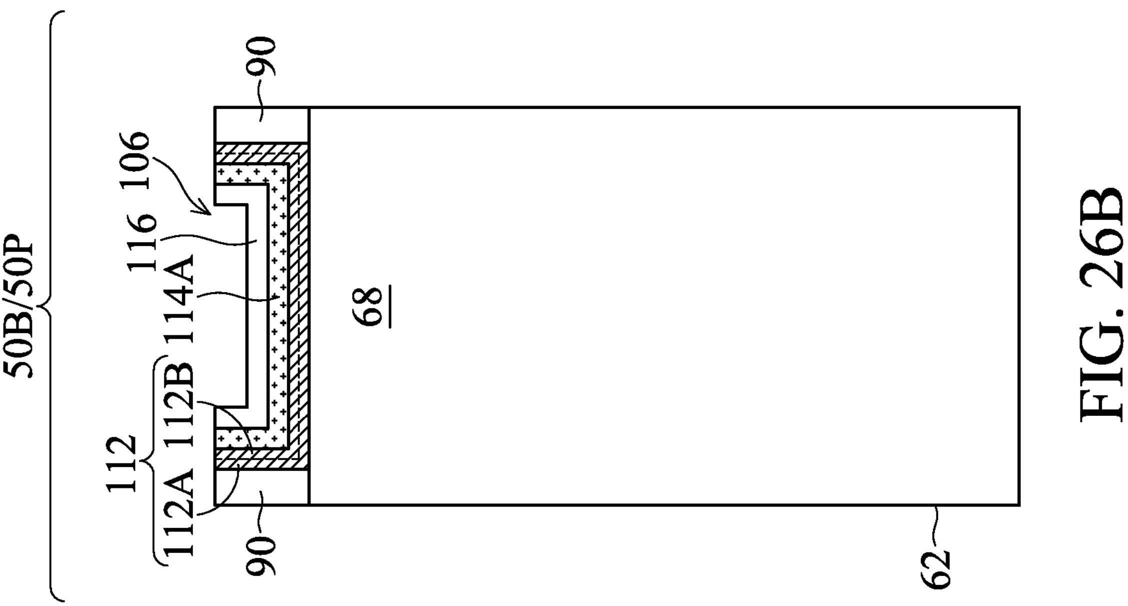
Figure 26A:
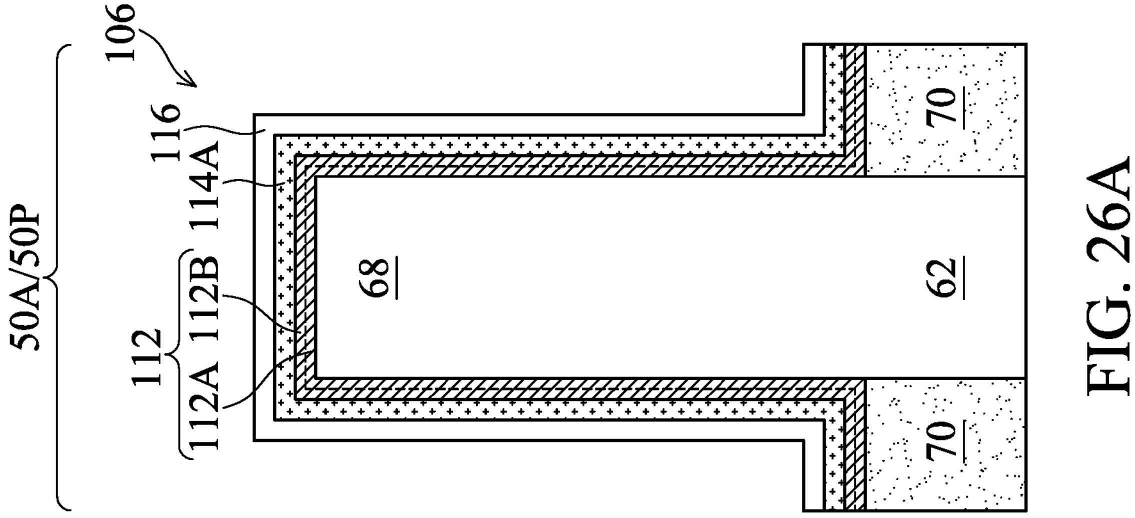

In FIGS. 26A-26B, a capping layer 116 is conformally formed on the p-type work function tuning layer 114A, such that it lines the recesses 106 in the p-type region 50P. The capping layer 116 may be formed in a similar manner as described for FIGS. 16A-16B. After the capping layer 116 is formed, an anneal process is performed to drive work function tuning element(s) from the capping layer 116 and/or the p-type work function tuning layer 114A into the gate dielectric layer 112. The anneal process may be performed in a similar manner as described for FIGS. 16A-16B.

Figure 27B:
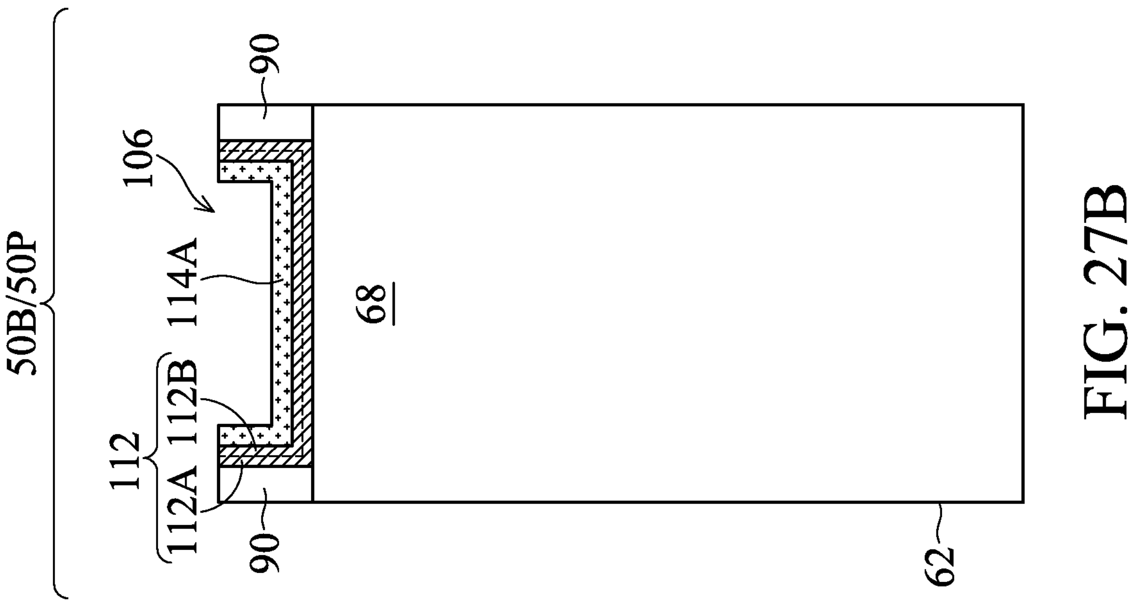
Figure 27A:
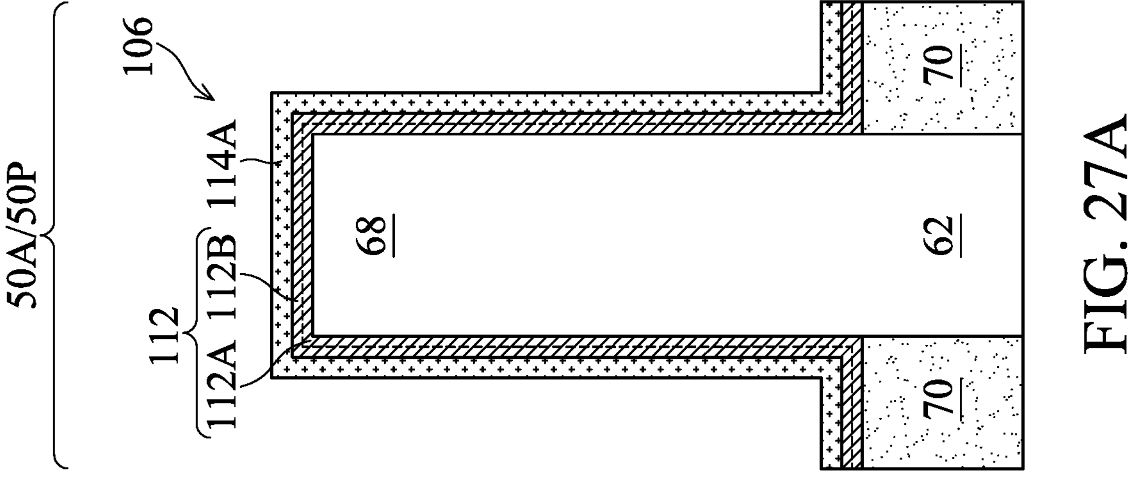

In FIGS. 27A-27B, the capping layer 116 is removed to expose the p-type work function tuning layer 114A. The capping layer 116 may be removed in a similar manner as described for FIGS. 17A-17B.

Figure 28B:
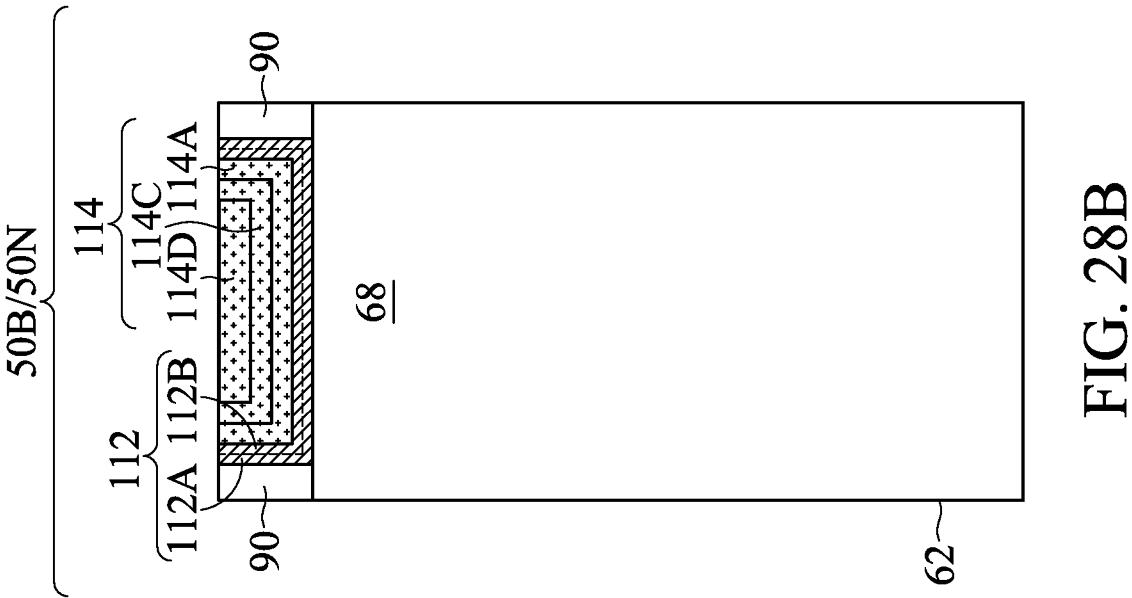
Figure 28A:
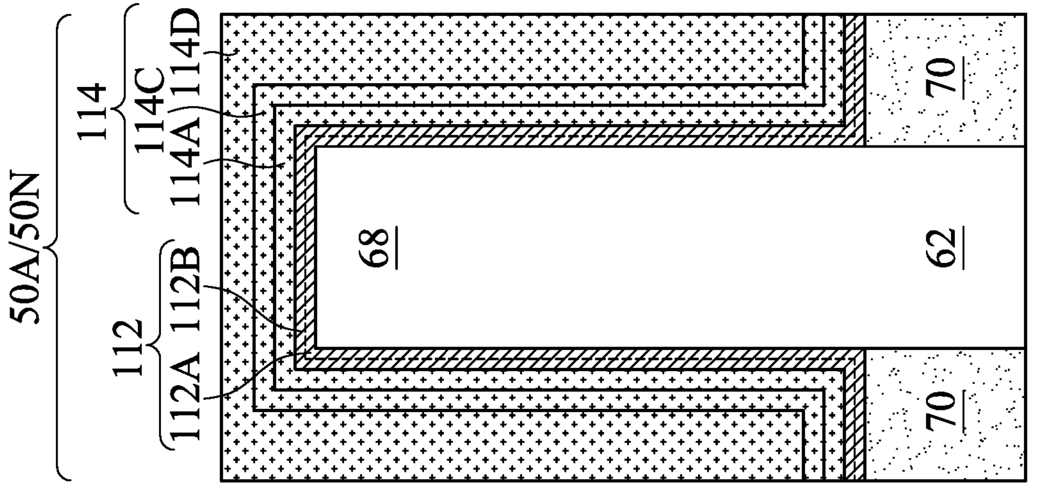

In FIGS. 28A-28B, the remaining portions of the gate electrode layer 114 are deposited on the p-type work function tuning layer 114A, thereby filling the remaining portions of the recesses 106 in the p-type region 50P. The remaining portions of the gate electrode layer 114 may be formed in a similar manner as described for FIGS. 18A-18B.

Figure 29B:
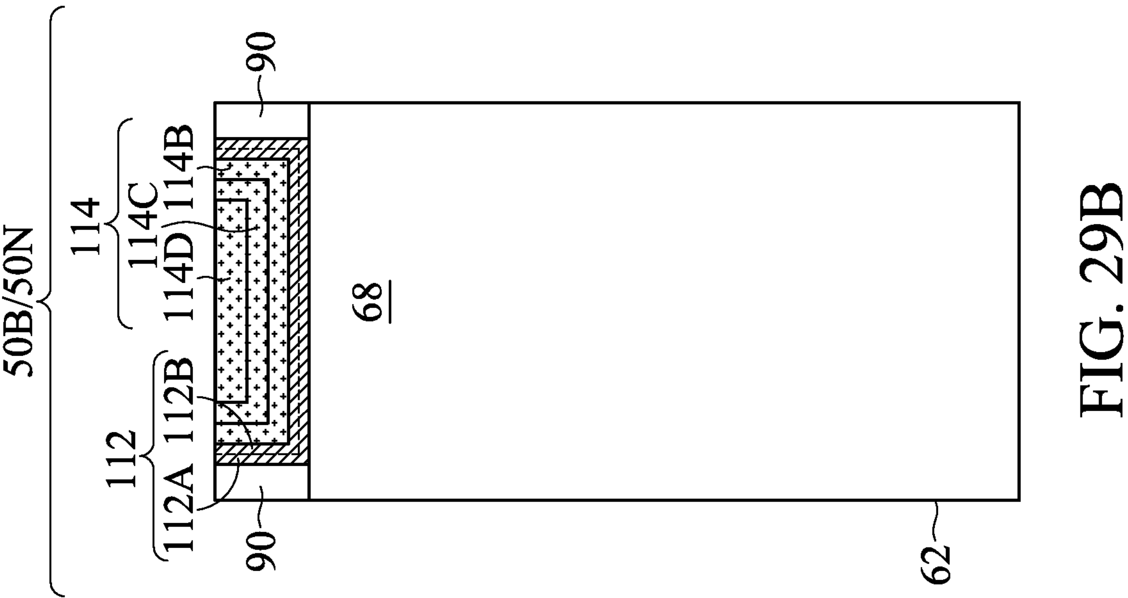
Figure 29A:
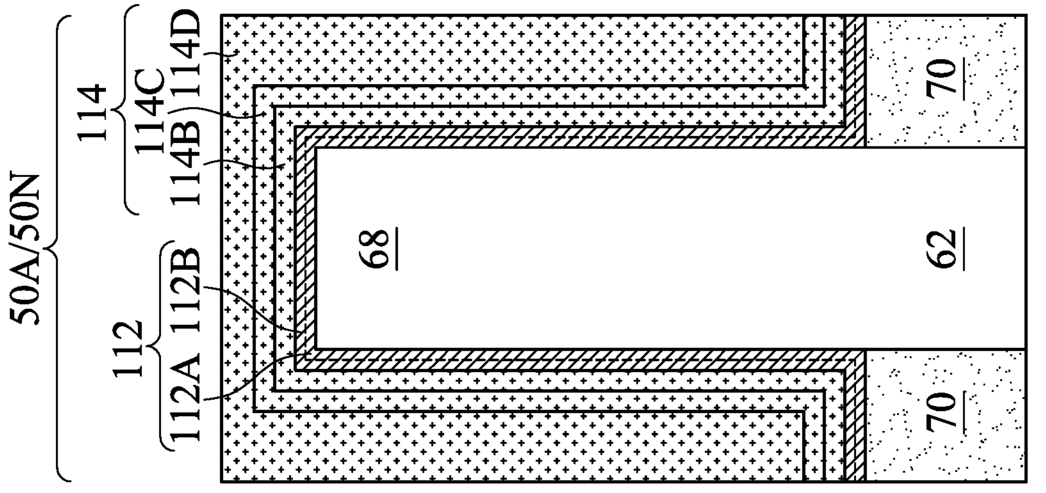

FIGS. 29A-29B illustrate a gate dielectric layer 112 and a gate electrode layer 114 for replacement gates, which are formed in the recesses 106 in the n-type region 50N. The gate dielectric layer 112 and the gate electrode layer 114 in the n-type region 50N may be formed in a similar manner as described for FIGS. 19A-19B.

Figure 30B:
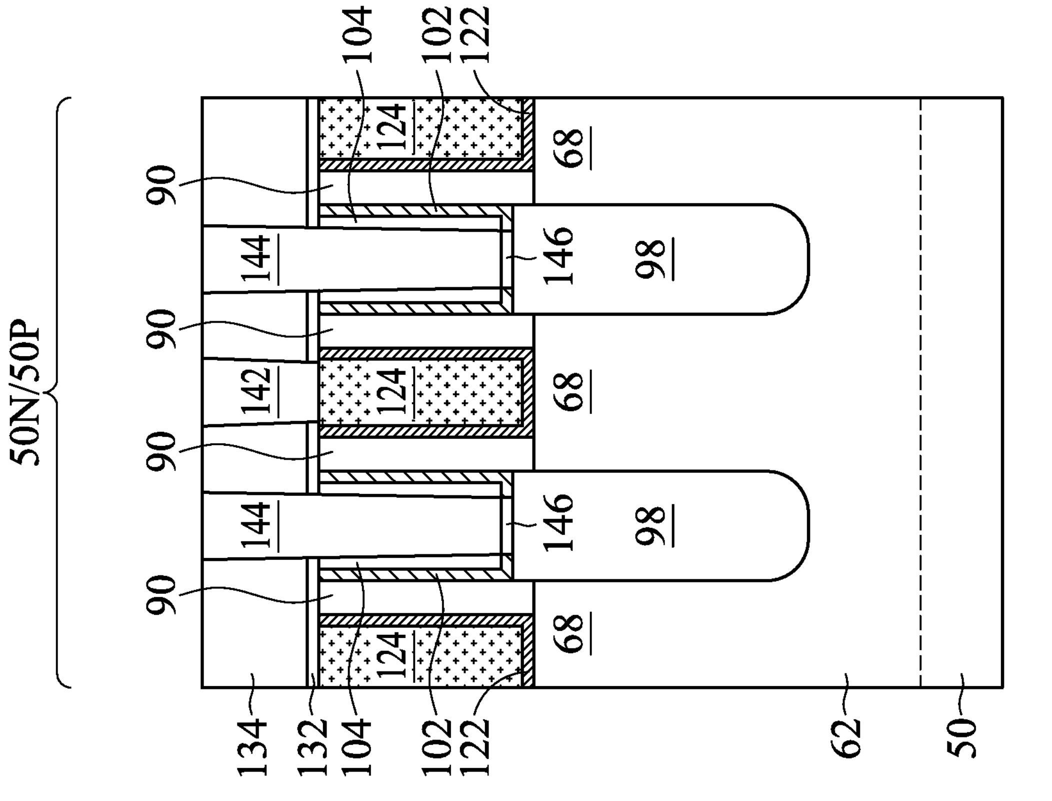
Figure 30A:
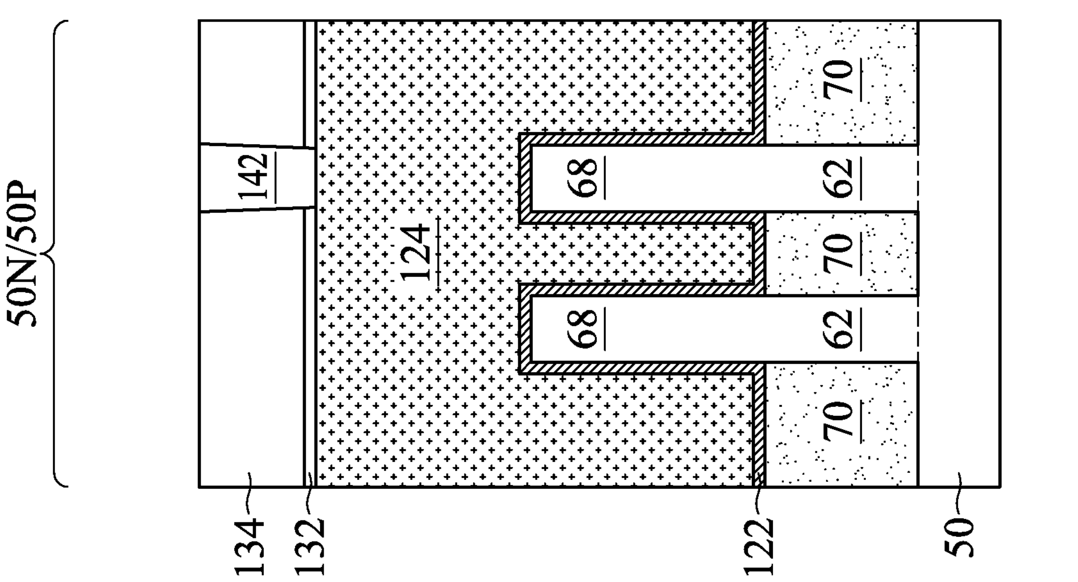

FIGS. 30A-30B show the FinFETs a similar stage of manufacturing as FIGS. 22A-22B. Appropriate steps as described above may be performed to form the features shown in FIGS. 30A-30B.

In an embodiment, a method includes: forming a gate dielectric layer on a channel region of a semiconductor feature; depositing a work function tuning layer on the gate dielectric layer, the work function tuning layer including a first work function tuning element; depositing a capping layer on the work function tuning layer with atomic layer deposition, the capping layer formed of an oxide or a nitride; performing an anneal process while the capping layer covers the work function tuning layer, the anneal process driving the first work function tuning element from the work function tuning layer into the gate dielectric layer; removing the capping layer to expose the work function tuning layer; and depositing a fill layer on the work function tuning layer. In some embodiments of the method, the capping layer is formed of aluminum oxide. In some embodiments of the method, removing the capping layer includes etching the capping layer with a dry etch using carbon tetrafluoride. In some embodiments of the method, removing the capping layer includes etching the capping layer with a wet etch using phosphoric acid. In some embodiments of the method, the anneal process is performed at a temperature in a range of 500° C. to 1000° C. and for a duration in a range of 1 millisecond to 5 minutes. In some embodiments of the method, the capping layer includes a second work function tuning element, and the anneal process drives the second work function tuning element from the capping layer into the gate dielectric layer. In some embodiments of the method, the first work function tuning element is titanium and the second work function tuning element is aluminum.

In an embodiment, a method includes: forming a gate dielectric layer around a first nanostructure and a second nanostructure; depositing a p-type work function tuning layer on the gate dielectric layer; depositing an aluminum oxide layer on the p-type work function tuning layer, where the aluminum oxide layer, the p-type work function tuning layer, and the gate dielectric layer conformally line an opening between the first nanostructure and the second nanostructure; annealing the aluminum oxide layer, the p-type work function tuning layer, and the gate dielectric layer; removing the aluminum oxide layer to expose the p-type work function tuning layer; and depositing a fill layer on the p-type work function tuning layer, the fill layer filling remaining portions of the opening between the first nanostructure and the second nanostructure. In some embodiments of the method, a thickness of the aluminum oxide layer is greater than a thickness of the p-type work function tuning layer and a thickness of the gate dielectric layer. In some embodiments of the method, the thickness of the aluminum oxide layer is in a range of 10 Å to 100 Å. In some embodiments of the method, the thickness of the p-type work function tuning layer and the thickness of the gate dielectric layer are each in a range of 10 Å to 30 Å. In some embodiments of the method, depositing the aluminum oxide layer includes: performing an atomic layer deposition cycle including: exposing the p-type work function tuning layer to trimethylaluminum; and exposing the p-type work function tuning layer to water; and repeating the atomic layer deposition cycle a number of times.

In an embodiment, a method includes: forming a gate dielectric layer on a channel region of a semiconductor feature; depositing a work function tuning layer on the gate dielectric layer, the work function tuning layer including a first work function tuning element; depositing a capping layer on the work function tuning layer, the capping layer including a second work function tuning element, the second work function tuning element different from the first work function tuning element; driving the first work function tuning element and the second work function tuning element into the gate dielectric layer by performing an anneal process while the capping layer covers the work function tuning layer; removing the capping layer; and depositing a fill layer on the work function tuning layer. In some embodiments of the method, the work function tuning layer is formed of a nitride of the first work function tuning element. In some embodiments of the method, the first work function tuning element is titanium. In some embodiments of the method, the capping layer is formed of an oxide of the second work function tuning element. In some embodiments of the method, the second work function tuning element is aluminum. In some embodiments of the method, the work function tuning layer is deposited by physical vapor deposition and the capping layer is deposited by atomic layer deposition. In some embodiments of the method, the semiconductor feature is a semiconductor fin. In some embodiments of the method, the semiconductor feature is a nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a gate dielectric layer on a channel region of a semiconductor feature;

depositing a work function tuning layer on the gate dielectric layer, the work function tuning layer comprising a first work function tuning element;

depositing a capping layer on the work function tuning layer with atomic layer deposition, the capping layer formed of an oxide or a nitride;

performing an anneal process while the capping layer covers the work function tuning layer, the anneal process driving the first work function tuning element from the work function tuning layer into the gate dielectric layer;

removing the capping layer to expose a top surface of the work function tuning layer above the channel region; and depositing a fill layer on the top surface of the work function tuning layer.

2. The method of claim 1, wherein the capping layer is formed of aluminum oxide.

3. The method of claim 2, wherein removing the capping layer comprises etching the capping layer with a dry etch using carbon tetrafluoride.

4. The method of claim 2, wherein removing the capping layer comprises etching the capping layer with a wet etch using phosphoric acid.

5. The method of claim 1, wherein the anneal process is performed at a temperature in a range of 500° C. to 1000° C. and for a duration in a range of 1 millisecond to 5 minutes.

6. The method of claim 1, wherein the capping layer comprises a second work function tuning element, and the anneal process drives the second work function tuning element from the capping layer into the gate dielectric layer.

7. The method of claim 6, wherein the first work function tuning element is titanium and the second work function tuning element is aluminum.

8. A method comprising:

forming a gate dielectric layer around a first nanostructure and a second nanostructure;

depositing a p-type work function tuning layer on the gate dielectric layer;

depositing an aluminum oxide layer on the p-type work function tuning layer, wherein the aluminum oxide layer, the p-type work function tuning layer, and the gate dielectric layer conformally line an opening between the first nanostructure and the second nanostructure;

annealing the aluminum oxide layer, the p-type work function tuning layer, and the gate dielectric layer;

removing a portion of the aluminum oxide layer to expose a portion of the p-type work function tuning layer underlying the removed portion of the aluminum oxide layer; and depositing a fill layer on the exposed portion of the p-type work function tuning layer, the fill layer filling remaining portions of the opening between the first nanostructure and the second nanostructure.

9. The method of claim 8, wherein a thickness of the aluminum oxide layer is greater than a thickness of the p-type work function tuning layer and a thickness of the gate dielectric layer.

10. The method of claim 9, wherein the thickness of the aluminum oxide layer is in a range of 10 Å to 100 Å.

11. The method of claim 9, wherein the thickness of the p-type work function tuning layer and the thickness of the gate dielectric layer are each in a range of 10 Å to 30 Å.

12. The method of claim 8, wherein depositing the aluminum oxide layer comprises:

performing an atomic layer deposition cycle comprising:

exposing the p-type work function tuning layer to trimethylaluminum; and exposing the p-type work function tuning layer to water; and repeating the atomic layer deposition cycle a number of times.

13. A method comprising:

forming a gate dielectric layer on a channel region of a semiconductor feature;

depositing a work function tuning layer on the gate dielectric layer, the work function tuning layer comprising a first work function tuning element;

depositing a capping layer on the work function tuning layer, the capping layer comprising a second work function tuning element, the second work function tuning element different from the first work function tuning element;

driving the first work function tuning element and the second work function tuning element into the gate dielectric layer by performing an anneal process while the capping layer covers the work function tuning layer;

after performing the anneal process, removing the capping layer; and depositing a fill layer on the work function tuning layer.

14. The method of claim 13, wherein the work function tuning layer is formed of a nitride of the first work function tuning element.

15. The method of claim 14, wherein the first work function tuning element is titanium.

16. The method of claim 13, wherein the capping layer is formed of an oxide of the second work function tuning element.

17. The method of claim 14, wherein the second work function tuning element is aluminum.

18. The method of claim 14, wherein the work function tuning layer is deposited by physical vapor deposition and the capping layer is deposited by atomic layer deposition.

19. The method of claim 13, wherein the semiconductor feature is a semiconductor fin.

20. The method of claim 13, wherein the semiconductor feature is a nanowire.

* * * * *